US012603500B2

(12) United States Patent
Martinez et al.

(10) Patent No.: US 12,603,500 B2
(45) Date of Patent: Apr. 14, 2026

(54) POWER CONTROL SYSTEM FOR POWER TRANSMISSION EQUIPMENT USING SOLID STATE SWITCHING DEVICES

(71) Applicant: Chevron U.S.A. Inc., San Ramon, CA (US)

(72) Inventors: Carlos Mauricio Martinez, Houston, TX (US); Gregory Joseph Clement, Sugar Land, TX (US); Masoud Hajiaghajani, Houston, TX (US)

(73) Assignee: CHEVRON U.S.A. INC., San Ramon, CA (US)

( * ) Notice: Subject to any disclaimer, the term of this patent is extended or adjusted under 35 U.S.C. 154(b) by 0 days.

(21) Appl. No.: 18/887,918

(22) Filed: Sep. 17, 2024

(65) Prior Publication Data

US 2026/0081425 A1     Mar. 19, 2026

(51) Int. Cl.
*H02J 3/18* (2026.01)
*H01F 29/02* (2006.01)
*H02J 3/1878* (2026.01)
*H03K 17/687* (2006.01)

(52) U.S. Cl.
CPC .......... *H02J 3/1878* (2013.01); *H03K 17/687* (2013.01); *H01F 29/02* (2013.01)

(58) Field of Classification Search
CPC ....... H02J 3/1878; H03K 17/687; H01F 29/02
USPC ........................................ 307/113
See application file for complete search history.

(56) References Cited

U.S. PATENT DOCUMENTS 6,396,248 B1    5/2002  Sen et al.
9,269,508 B2    2/2016  Reich et al.

FOREIGN PATENT DOCUMENTS

CN       201689773 U    12/2010
ES        1197115 U    11/2017

OTHER PUBLICATIONS

Jawad Faiz et al., Solid-state tap-changer of transformers: Design, control and implementation, Elsevier, Electrical Power and Energy Systems, vol. 33 (2011), pp. 210-218, 9 pages.
Dhyvia Sampath Kumar et al., Review of power system impacts at high PV penetration Part II: Potential solutions and the way forward, Elsevier, Solar Energy, vol. 210 (2020), pp. 202-221, published Aug. 26, 2020, 20 pages.

(Continued)

*Primary Examiner* — Hal Kaplan
(74) *Attorney, Agent, or Firm* — Smith & Woldesenbet Law Group, PLLC

(57)            ABSTRACT

A system for providing power control for power transmission equipment may include multiple solid state on-load tap changers (SSOLTCs) electrically coupled to a phase of the power transmission equipment. The system may also include a sensor device configured to measure a parameter associated with power flowing through the phase of the power transmission equipment. The system may further include a controller communicably coupled to the SSOLTCs and the sensor device, where the controller is configured to obtain a measurement of the parameter from the sensor device at a point in time; determine that the parameter falls outside an acceptable operating range based on a current state of the SSOLTCs; determine a configuration of the SSOLTCs that, when implemented, results in the parameter returning to the acceptable operating range; and operate one or more of the SSOLTCs to achieve the configuration at the point in time.

20 Claims, 10 Drawing Sheets

(56)    References Cited

OTHER PUBLICATIONS

Salah Eldeen Gasim Mohamed et al., Power transistor-assisted Sen Transformer: a novel approach to power flow control, Elsevier, Electric Power Systems Research, vol. 133 (2016), pp. 228-240, published Jan. 13, 2016, 13 pages.

Yuhang, Pan et al., On switching transient modeling and analysis of electronic on-load tap-changers based Sen transformer, Elsevier, Electric Power and Energy Systems, vol. 130 (2021), No. 107024, published on Apr. 3, 2021, 10 pages.

Lu Qiran et al., Research on coordinated control of flexible on-load voltage regulator and Statcom, Elsevier, Energy Reports, vol. 8 (2022), pp. 994-1002, presented that The 5th International Conference on Electrical Engineering and Green Energy, CEEGE 2022, Jun. 8-11, 2022, Berlin, Germany, 9 pages.

Zhao-Yulin Dong-Shoutian Liang-Qiuyan et al., Design of Non-Contact On-Load Automatic Regulate Voltage Transformer, Journal of Northeast Agricultural University (English Edition), vol. 22, Issue 3, 2015, 4 pages.

699

1100

1300

POWER CONTROL SYSTEM FOR POWER TRANSMISSION EQUIPMENT USING SOLID STATE SWITCHING DEVICES

TECHNICAL FIELD

The present application is related to power control systems and, more particularly, to power control systems for power transmission equipment using solid state switching devices.

BACKGROUND

Electric power is commonly transmitted over long distances (e.g., tens of miles, hundreds of miles) at high voltages (e.g., above 69 kV AC phase to phase). Transmitting power over long distances results in poor power quality, such as significant voltage variations at the far end (away from the source and toward the load) and large swings of reactive power exchange between the source and distant load components of the circuits. These variations may be outside the operating capability (e.g., in terms of magnitude, in terms of the rate of change) of the connected equipment. Such long circuits may contain large quantities of capacitance (e.g., depending on the loading on the circuit), resulting in high voltage at the far end of those circuits. The resulting reactive power requirements need to be fulfilled during steady-state and transient conditions. To compensate for these conditions, power control and mitigation equipment are used to control the voltages and reactive power flow.

Power control and mitigation equipment may be located at one or more nodes of a power transmission system. The location and type of control equipment may depend on factors such as the system characteristics, the characteristics of the load, and operating needs. Existing equipment to mitigate these events utilize a combination of transformers, reactors, capacitors, static var compensators (SVCs), and variations thereof. Transformers and reactors are commonly fitted with mechanical on-load tap changers. Reactors may also be connected via solid state controllers (e.g., thyristor controller rectifiers (TCRs)). Solid state controllers such as SVCs and TCRs may be large, costly, and result in disruptive harmonics being injected into the power system. While transformers are used for direct voltage control and the other equipment (e.g., SVCs, TCRs) are used for direct reactive power control, control of one aspect of the power (e.g., voltage) affects the other aspect of the power (e.g., reactive power). As a result, transformers and the other power control equipment must be controlled in coordination with each other in real time.

A system to control voltage and reactive power needs to respond to transients that may last several seconds in addition to steady state conditions. Mechanical on load tap changers (OLTCs) are the current industry standard to control voltage and reactive power with respect to transformers and reactors, but these devices are sometimes too slow to effectively meet the changes under transient conditions. Also, since OLTCs are mechanical in nature, they may be unreliable and require regular maintenance to operate in the long term. As discussed above, direct and reactive power influence each other, and so the power relationship between reactive power and voltage is such that controlling reactive power results in indirect, and limited, control of voltage. As a result, fast reactive power control may be used during transient conditions to provide, to a limited extent, voltage control.

Conventional solid state controllers are sometimes used to provide reactive power control as a complement to the mechanical OLTCs, mainly when a fast response is needed. However, solid state controllers have a number of drawbacks when used in these circumstances. For example, solid state controllers (such as SVCs) are large and complex. As another example, solid state controllers may inject undesirable harmonics of their own into the system. As yet another example, solid state controllers (as well as mechanical OLTCs) have limited capacity for rapid control of voltage swings.

SUMMARY

In general, in one aspect, the disclosure relates to a power control system for power transmission equipment. The power control system includes a plurality of solid state on-load tap changers (SSOLTCs) electrically coupled to a phase of the power transmission equipment. The power control system also includes a sensor device configured to measure a parameter associated with power flowing through the phase of the power transmission equipment. The power control system further includes a controller communicably coupled to the plurality of SSOLTCs and the sensor device. The controller is configured to obtain a measurement of the parameter associated with power flowing through the phase of the power transmission equipment from the sensor device at a point in time. The controller is also configured to determine, based on the measurement and at the point in time, that the parameter falls outside an acceptable operating range based on a current configuration of the plurality of SSOLTCs. The controller is further configured to identify a target configuration of the plurality of SSOLTCs that, when implemented, results in the parameter returning to the acceptable operating range. The controller is also configured to operate one or more of the plurality of SSOLTCs to achieve the target configuration at the point in time.

In another aspect, the disclosure relates to a method for providing power control for power transmission equipment. The method includes obtaining, at a point in time, a measurement of a parameter associated with power flowing through a phase of the power transmission equipment from a sensor device. The method also includes determining, based on the measurement and at the point in time, that the parameter falls outside an acceptable operating range based on a current configuration of a plurality of solid state on-load tap changers (SSOLTCs) that are electrically coupled to the phase of the power transmission equipment. The method further includes identifying a target configuration of the plurality of SSOLTCs that, when implemented, results in the parameter returning to the acceptable operating range. The method also includes facilitating operation of one or more of the plurality of SSOLTCs to achieve the target configuration at the point in time.

These and other aspects, objects, features, and embodiments will be apparent from the following description and the appended claims.

BRIEF DESCRIPTION OF THE DRAWINGS

The drawings illustrate only example embodiments and are therefore not to be considered limiting in scope, as the example embodiments may admit to other equally effective embodiments. The elements and features shown in the drawings are not necessarily to scale, emphasis instead being placed upon clearly illustrating the principles of the example embodiments. Additionally, certain dimensions or positions may be exaggerated to help visually convey such principles. In the drawings, reference numerals designate like or corresponding, but not necessarily identical, elements.

DETAILED DESCRIPTION

Figure 1:
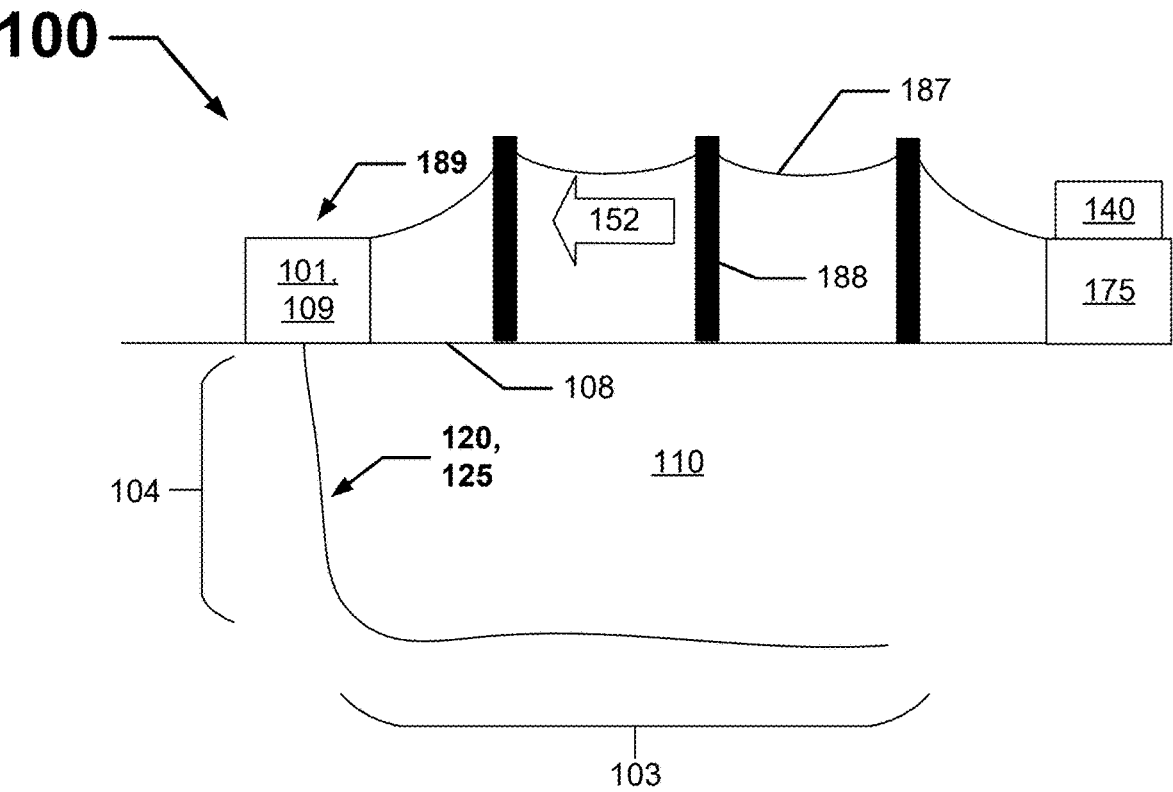
FIGS. 1 through 4 show field systems in which example power control systems may be used according to certain example embodiments.

The example embodiments discussed herein are directed to systems, apparatus, methods, and devices for power control systems for power transmission equipment using solid state switching devices. Example embodiments may be used for subterranean field operations that are based on land or off shore. Example embodiments may also be used for other applications where the electrical load and/or the power generation sources are located long distances (e.g., several miles, hundreds of miles) away from power transmission equipment. Example embodiments may be customized to meet variations in a particular power dynamic based on equipment in the field system.

Example embodiments may be designed to comply with certain standards and/or requirements. Examples of entities that set such standards and/or requirements may include, but are not limited to, the Society of Petroleum Engineers, the Amerimay Petroleum Institute (API), the International Standards Organization (ISO), the Institute of Electrical and Electronics Engineers (IEEE), and the Occupational Safety and Health Administration (OSHA). Each component of a power control system (including portions thereof) may be made of one or more of a number of suitable materials, including but not limited to metal (e.g., stainless steel), ceramic, rubber, glass, fibrous material, and plastic.

It is understood that when combinations, subsets, groups, etc. of elements are disclosed (e.g., combinations of components in a composition, or combinations of steps in a method), that while specific reference of each of the various individual and collective combinations and permutations of these elements may not be explicitly disclosed, each is specifically contemplated and described herein. By way of example, if an item is described herein as including a component of type A, a component of type B, a component of type C, or any combination thereof, it is understood that this phrase describes all of the various individual and collective combinations and permutations of these components. For example, in some embodiments, the item described by this phrase could include only a component of type A. In some embodiments, the item described by this phrase could include only a component of type B. In some embodiments, the item described by this phrase could include only a component of type C.

In some embodiments, the item described by this phrase could include a component of type A and a component of type B. In some embodiments, the item described by this phrase could include a component of type A and a component of type C. In some embodiments, the item described by this phrase could include a component of type B and a component of type C. In some embodiments, the item described by this phrase could include a component of type A, a component of type B, and a component of type C. In some embodiments, the item described by this phrase could include two or more components of type A (e.g., A1 and A2). In some embodiments, the item described by this phrase could include two or more components of type B (e.g., B1 and B2). In some embodiments, the item described by this phrase could include two or more components of type C (e.g., C1 and C2).

In some embodiments, the item described by this phrase could include two or more of a first component (e.g., two or more components of type A (A1 and A2)), optionally one or more of a second component (e.g., optionally one or more components of type B), and optionally one or more of a third component (e.g., optionally one or more components of type C). In some embodiments, the item described by this phrase could include two or more of a first component (e.g., two or more components of type B (B1 and B2)), optionally one or more of a second component (e.g., optionally one or more components of type A), and optionally one or more of a third component (e.g., optionally one or more components of type C). In some embodiments, the item described by this phrase could include two or more of a first component (e.g., two or more components of type C (C1 and C2)), optionally one or more of a second component (e.g., optionally one or more components of type A), and optionally one or more of a third component (e.g., optionally one or more components of type B).

If a component of a figure is described but not expressly shown or labeled in that figure, the label used for a corresponding component in another figure may be inferred to that component. Conversely, if a component in a figure is labeled but is not described, the description for such component may be substantially the same as the description for the corresponding component in another figure. The numbering scheme for the various components in the figures herein is such that each component is a three-digit number or a four-digit number, and corresponding components in other figures have the identical last two digits. For any figure shown and described herein, one or more of the components may be omitted, added, repeated, and/or substituted. Accordingly, embodiments shown in a particular figure should not be considered limited to the specific arrangements of components shown in such figure.

Further, a statement that a particular embodiment (e.g., as shown in a figure herein) does not have a particular feature or component does not mean, unless expressly stated, that such embodiment is not capable of having such feature or component. For example, for purposes of present or future claims herein, a feature or component that is described as not being included in an example embodiment shown in one or more particular drawings is capable of being included in one or more claims that correspond to such one or more particular drawings herein.

Example embodiments of power control systems for power transmission equipment using solid state switching devices will be described more fully hereinafter with reference to the accompanying drawings, in which example embodiments of power control systems for power transmission equipment using solid state switching devices are shown. Power control systems for power transmission equipment using solid state switching devices may, however, be embodied in many different forms and should not be construed as limited to the example embodiments set forth herein. Rather, these example embodiments are provided so that this disclosure will be thorough and complete, and will fully convey the scope of power control systems for power transmission equipment using solid state switching devices to those of ordinary skill in the art. Like, but not necessarily the same, elements (also sometimes called components) in the various figures are denoted by like reference numerals for consistency.

Terms such as "first", "second", "primary," "secondary," "above", "below", "inner", "outer", "distal", "proximal", "end", "top", "bottom", "upper", "lower", "side", "left", "right", "front", "rear", and "within", when present, are used merely to distinguish one component (or part of a component or state of a component) from another. This list of terms is not exclusive. Such terms are not meant to denote a preference or a particular orientation, and they are not meant to limit embodiments of power control systems for power transmission equipment using solid state switching devices. In the following detailed description of the example embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 2:
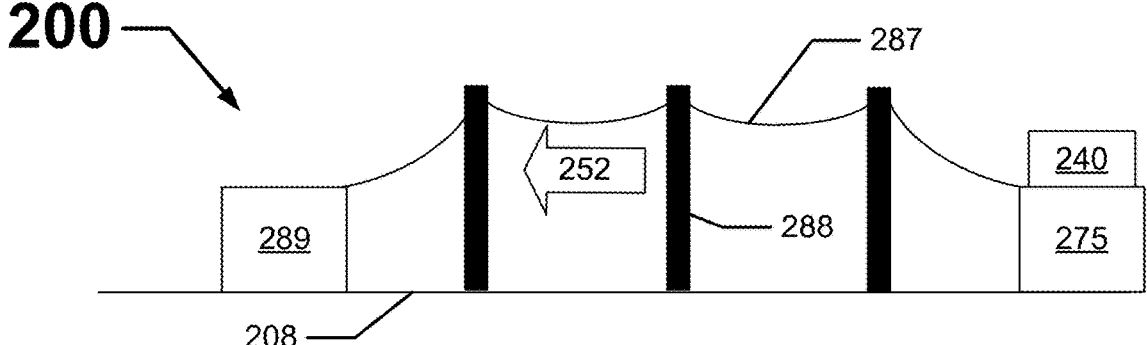
Figure 3:
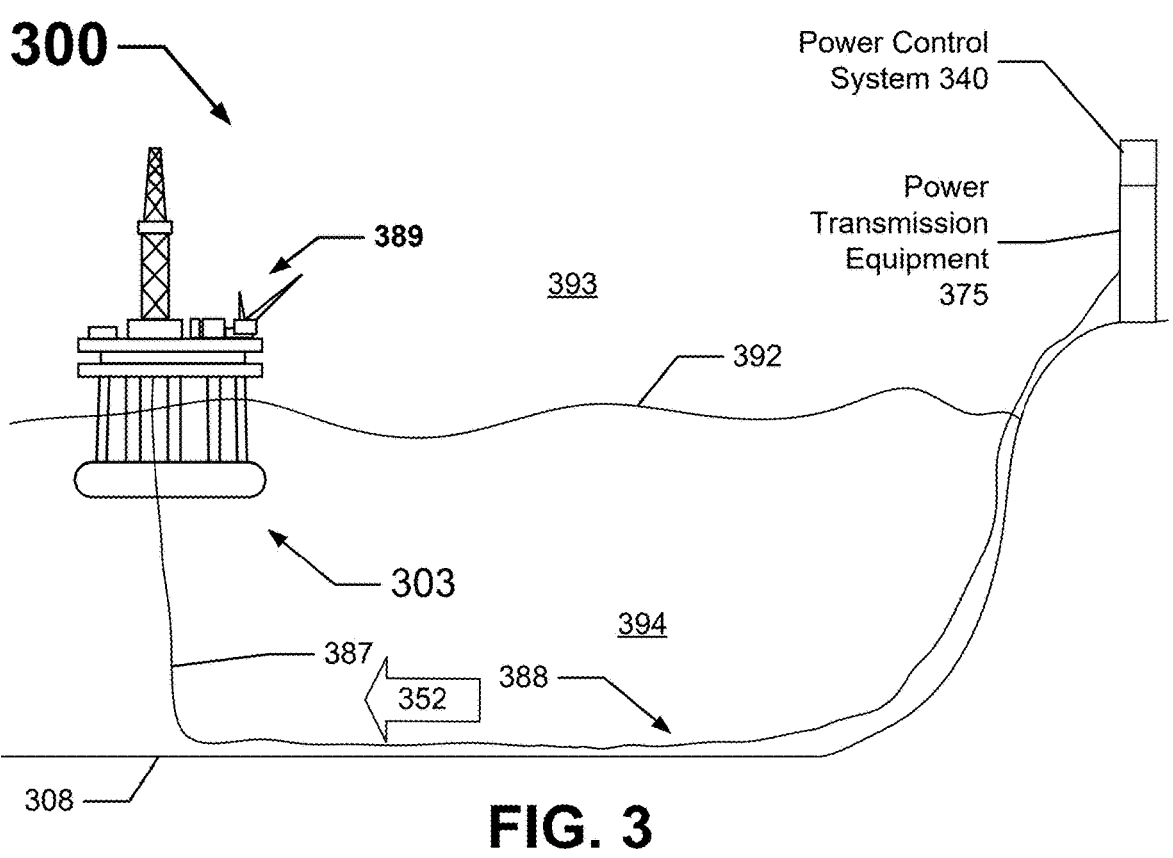
Figure 4:
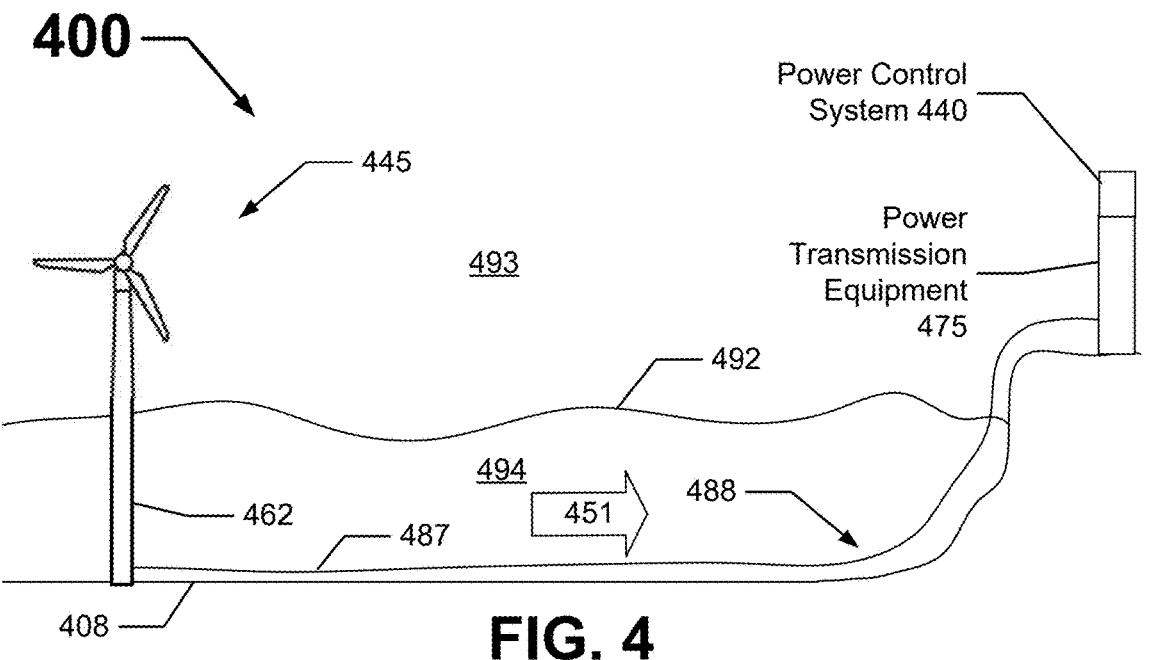

FIGS. 1 through 4 show systems in which example power control systems may be used according to certain example embodiments. Specifically, FIG. 1 shows a diagram of a land-based system 100 that includes one or more example power control systems 140 used with respect to power transmission equipment 175. FIG. 2 shows a diagram of another land-based system 200 that includes one or more example power control systems 240 used with respect to power transmission equipment 275. FIG. 3 shows a diagram of a marine-based oilfield system 300 that includes one or more example power control systems 340 used with respect to power transmission equipment 375. FIG. 4 shows a diagram of an offshore wind-powered generating system 400 that includes one or more example power control systems 440 used with respect to power transmission equipment 475.

The field system 100 of FIG. 1 includes a wellbore 120 disposed in a subterranean formation 110 using an electrical load 189 in the form of field equipment 109 (e.g., a derrick, a tool pusher, a clamp, a tong, drill pipe, casing pipe, a drill bit, a wireline tool, a fluid pumping system, a motor, a variable frequency drive, a compressor, an energy transfer device (e.g., a step down transformer, an inverter, a converter)) located on or near a rig 101 located above a surface 108. In some cases, some of the field equipment 109 may be located within the wellbore 120.

The field system 100 of FIG. 1 also includes power transmission equipment 175 and an example power control system 140. The power transmission equipment 175 manipulates (e.g., transforms, inverts, converts) and/or transmits power 152 (also called manipulated power 152 herein) to the electrical load 189 on or near the rig 101. Examples of power transmission equipment 175 may include, but are not limited to, transformers, inverters, converters, shunt reactors, static VAR compensators, static synchronous compensators, and capacitor banks. The power transmission equipment 175 may also include ancillary equipment, including but not limited to circuit breakers, protective relays, switches, arrestors, meters, and controllers.

The power transmission equipment 175 is configured to receive power that is subsequently manipulated into the manipulated power 152 that travels along the power transfer links 187 to the electrical load 189. The power received by the power transmission equipment 175 originates from one or more power generation sources (e.g., a coal-fired power plant, a nuclear power plant, a natural gas-fired power plant, a wind farm, a cogeneration facility). The power transmission equipment 175 may receive the power directly or indirectly (e.g., via other power transmission equipment) from a power generation source.

The manipulated power 152 may include real and/or reactive components. The manipulated power 152 is transmitted from the power transmission equipment 175 to the electrical load 189 using one or more power transfer links 187. Each power transfer link 187 may include one or more electrical conductors, which may be individual or part of one or more electrical cables. Each power transfer link 187 may be sized (e.g., 2/0 AWG, #6 gauge, 750 mm$^2$) in a manner suitable for the amount (e.g., 2.3 kV, 4 kV, 34 kV, 138 kV, 230 kV, 345 kV) and type (e.g., alternating current (AC), direct current (DC)) of manipulated power 152 flowing therethrough.

The power transfer links 187 may be or include transmission lines and/or distribution lines. The power transfer links 187 may be supported by an infrastructure 188 that may be or include multiple components, including but not limited to poles, towers, transformers, inverters, static VAR compensators, static synchronous compensators, capacitor banks, arrestors, circuit breakers, protective relays, sensor devices, meters, switches, and controllers. The example power control system 140 may include multiple switches, at least one sensor device, and at least one controller. More details as to these and other components of the example power control system 140 are discussed below with respect to FIG. 5. The example power control system 140 may be used to regulate the manipulated power 152 delivered by the power control system 140 in real time.

The wellbore 120 may be any of a number of types of wells (e.g., production wells, injection wells, sequestration wells). Also, in this case, the wellbore 120 has a substantially vertical section 104 and a substantially horizontal section 103. The composition of the field equipment 109 of the field system 100 may change based on the stage of the field operation. As a result, the demand (instantaneous usage) and consumption (cumulative usage over a period of time) of electricity may change, depending on the field equipment 109 used for a particular stage of a field operation. With respect to the field system 100 of FIG. 1, once the wellbore 120 (or a portion thereof) is drilled, a casing string 125 is inserted into the wellbore 120 (at least to the extent drilled at that time) to stabilize the wellbore 120 and allow for the eventual extraction of subterranean resources (e.g., natural gas, oil, produced water) from the subterranean formation 110. Field equipment 109, located at the surface 108, is used to drill, encase, fracture, produce, and/or perform any other part of a field operation with respect to the wellbore 120. The wellbore 120 of FIG. 1 starts out as substantially vertical (vertical section 104), and then has a substantially horizontal section 103. This configuration of the wellbore 120 is common for exploration and production of subterranean resources, such as oil and natural gas, in shale and other tight formations in relatively remote areas on land.

The field system 200 of FIG. 2 is similar to the field system 100 of FIG. 1, except in this case the electrical load 289 of the field system 200 of FIG. 2 is for some other purpose (e.g., a factory, a processing facility, an assembly plant). Specifically, the field system 200 of FIG. 2 includes power transmission equipment 275 that manipulates power received, directly or indirectly, from one or more power sources to send manipulated power 252 to the electrical load 289 along energy transfer links 287 to the electrical load 289. An example power control system 240 is used to regulate the manipulated power 252 delivered by the power transmission equipment 275 in real time. The power transfer links 287 may be supported by an infrastructure 288. The power transmission equipment 275, the energy transfer links 287, the infrastructure 288, the manipulated power 252, and the example power control system 240 of the field system 200 of FIG. 2 are substantially the same as the power transmission equipment 175, the energy transfer links 187, the infrastructure 188, the manipulated power 152, and the example power control system 140 discussed above with respect to the field system 100 of FIG. 1.

The electrical load 289 of the field system 200 of FIG. 2 is located at or near the surface 208 of land. The electrical load 289 may be located in a relatively remote location (remote from other significant electrical loads) or in an area close to other significant electrical loads. The electrical load 289 may include, but is not limited to, lighting systems, control systems, motors, actuators, pumps, compressors, cranes, office space, lift stations, HVAC units, processing equipment, sensor devices, and fire protection systems.

The field system 300 of FIG. 3 includes a floating platform 303 (e.g., a FPSO unit, a semi-submersible rig) in a body of water 394 (e.g., a lake, an ocean). In alternative embodiments, as when the distance between the surface 308 and the water line 392 is relatively small (e.g., a few hundred feet), the platform 303 is fixed (e.g., a jack-up rig) instead of floating. The floating platform 303 in this case may be used for offshore operations (e.g., oil production, gas production, injection of carbon dioxide). The floating platform 303 floats at the water line 392 some distance above a surface 308 in the form of a seabed. The floating platform 303 has an electrical load 389 that is fed manipulated power 352 by a power transfer link 387 that is located at or near the surface 308 in the water 394 until reaching the floating platform 303. The manipulated power 352 is provided by power transmission equipment 375 located outside the water 394. An example power control system 340 is used to regulate the manipulated power 352 provided by the power transmission equipment 375. At least part of the floating platform 303 and at least some of the electrical load 389 are exposed to ambient air 393 above the water line 392.

The field system 300 of FIG. 3 may also include infrastructure 388 along the surface 308 (the seabed) that is used to support and/or protect the energy transfer links 387 in the water 394. The electrical load 389 of FIG. 3 may be substantially the same as the electrical load 189 of the field system 100 of FIG. 1. Similarly, the power transmission equipment 375, the energy transfer links 387, the manipulated power 352, and the example power control system 340 of the field system 300 of FIG. 3 are substantially the same as the power transmission equipment, the energy transfer links, the power, and the example power control systems discussed above with respect to the field system 100 of FIG. 1 and the field system 200 of FIG. 2.

The field system 400 of FIG. 4 includes a power generation source 445 in the form of a wind turbine that is used to generate unmanipulated power 451. The unmanipulated power 451 in this case is a type of electrical power before being manipulated by the power transmission equipment 475. The power generation source 445 is placed atop a tower 462 that is mounted into a surface a surface 408 in the form of a seabed. The tower 462 is tall enough for its top end, where the power generation source 445 is mounted, to extend above the water line 492 into the ambient air 493.

The unmanipulated power 451 that is generated by the power generation source 445 travels through power transfer links 487 that spans mostly in the water 494 from the bottom end of the tower 462, at or near the surface 408 in the water 494 until reaching power transmission equipment 475 on land outside the water 494. An example power control system 440 may be used to regulate the unmanipulated power 451 provided to the power transmission equipment 475. In alternative embodiments, the power transmission equipment 475 and/or the electrical load that receives the power may be at or near the surface 408 in the water 494 and/or on a platform (e.g., similar to the floating platform 303 of FIG. 3) in the water 494.

The field system 400 of FIG. 4 may also include infrastructure 488 along the surface 408 (the seabed) that is used to support and/or protect the energy transfer links 487 in the water 494. The electrical load, not shown in FIG. 4, is located downstream of the power transmission equipment 475. The power transmission equipment 475, the energy transfer links 487, and the example power control system 440 of the field system 400 of FIG. 4 are substantially the same as the power transmission equipment, the energy transfer links, and the example power control systems discussed above with respect to the field system 100 of FIG. 1, the field system 200 of FIG. 2, and the field system 300 of FIG. 3.

Is should be understood by those of ordinary skill in the art that example embodiments may be applied to any of a number of other situations and/or environments that are not capture in FIGS. 1 through 4. For example, example embodiments may be used with offshore power transmission via submarine cables or power umbilical cables from one topside facility to another topside facility. As another example, example embodiments may be used with offshore power transmission via submarine cables or power umbilical cables from one topside facility to a subsea facility.

Figure 5:
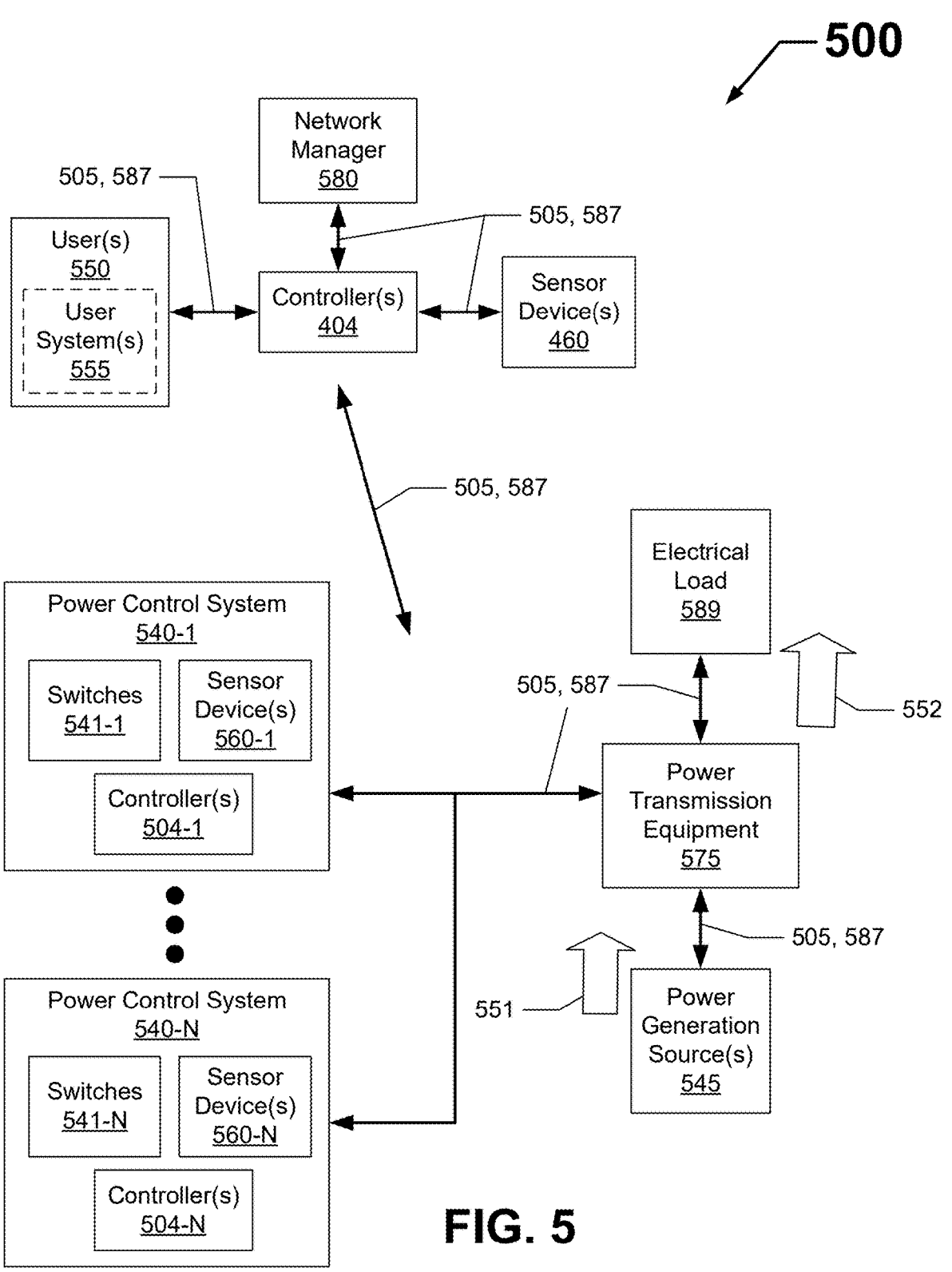
FIG. 5 shows a block diagram of a general system in which an example power control system may be used according to certain example embodiments.

FIG. 5 shows a block diagram of a general field system 500 in which an example power control system 540 may be used according to certain example embodiments. Referring to the description with respect to FIGS. 1 through 4 above, the system 500 of FIG. 5 includes one or more power generation sources 545, power transmission equipment 575, one or more power control systems 540, an electrical load 589, one or more controllers 404, one or more sensor devices 460, one or more users 550 (including one or more optional user systems 555), and a network manager 580. Each of the example power control systems 540 includes multiple switches 541, one or more sensor devices 560, and one or more controllers 504. For example, the power control system 540-1 includes multiple switches 541-1, one or more sensor devices 560-1, and one or more controllers 504-1. As another example, the power control system 540-N includes multiple switches 541-N, one or more sensor devices 560-N, and one or more controllers 504-N.

The components shown in FIG. 5 are not exhaustive, and in some embodiments, one or more of the components shown in FIG. 5 may not be included in the example field system 500. Any component of the field system 500 may be discrete or combined with one or more other components of the field system 500. Also, one or more components of the field system 500 may have different configurations. For example, there may be one controller 504 that is shared among all of the power control systems 540. As another example, there may be one sensor device 560 that is shared among all of the power control systems 540. As yet another example, a controller 504, rather than being a stand-alone device, may be part of one or more other components (e.g., the power transmission equipment 575) of the field system 500.

The one or more power generation sources 545 may generate and/or otherwise provide unmanipulated power 551 to the power transmission equipment 575 for manipulation into manipulated power 552, which is eventually used by the electrical load 589. As defined herein, the unmanipulated power 551 and manipulated power 552 are with respect to the power transmission equipment 575 and its function. For example, the unmanipulated power 551 may have already been manipulated at least once (e.g., by other power transmission equipment positioned between the power transmission equipment 575 and one or more of the power generation sources 545) upstream of the power transmission equipment 575. Similarly, the manipulated power 552 may further be manipulated (e.g., by other power transmission equipment) before reaching some or all of the electrical load 589.

The unmanipulated power 551 provided by the power generation sources 545 is delivered to the power transmission equipment 575 using power transfer links 587. A power generation source 545 may be or include a generator and/or an energy storage facility. A power generation source 545 may also include ancillary equipment, including but not limited to transmission lines, distribution lines, meters, transformers, inverters, circuit breakers, switchgear, protective relays, one or more controllers (e.g., controllers 504), one or more sensor devices (e.g., sensor devices 560), and arresters.

In some cases, the unmanipulated power 551 provided by the power generation sources 545 at a point in time may be limited and/or may have amount of reactive power (e.g., VARs). Such events may be a function of one or more of a number of factors. Such factors may include, but are not limited to, ambient temperature (e.g., where the power transfer links 587 are located), humidity, nameplate capacity of a transformer, power factor, size of transmission lines, material of transmission lines, and distance between the power generation source 545 and the power transmission equipment 575.

In order to maintain the integrity of the power transfer links 587 and reliable delivery of power (e.g., unmanipulated power 551, manipulated power 552) within the field system 500, the real and reactive components of the power are kept within a range of acceptable values. If the real or reactive component of power falls outside these ranges of acceptable values, even for a brief period of time (e.g., a few cycles), a situation (e.g., under frequency, over frequency) may arise that trips off some or all of the field system 500.

The electrical load 589 consumes the manipulated power 552 from the power transmission equipment 575 continuously and in real time. The electrical load 589 may be represented in terms of demand (e.g., instantaneous usage in terms of MW or kW), usage (e.g., in terms of kWhs, in terms of MWhs) over a period of time (e.g., a month, a day), and/or any other designation of power. The manipulated power 552 used by the electrical load 589 is delivered by the power transmission equipment 575 using power transfer links 587. The power transmission equipment 575 provides an amount of manipulated power 552 that substantially matches the instantaneous demand of the electrical load 589 in real time.

In some cases, the demand of the electrical load 589 may fluctuate within a relatively wide range (e.g., between 0 MW and 85 MW, between 0 kW and 3700 kW, within ±10 MW of an average, within ±25 MW of an average), and at a relatively fast rate of change (e.g., 300 kW/s-500 kW/s), and some of the demand levels of the electrical load 589 may exceed the maximum level of manipulated power 552 that the power transmission equipment 575 may reliably deliver to the electrical load 589. At all times, the example power control systems 540 are configured to regulate and control the power transmission equipment 575 so that the manipulated power 552 received by the electrical load 589 from the power transmission equipment 575 meets the demand (within acceptable ranges) of the electrical load 589 in real time.

As discussed above with respect to the power transmission equipment 175 of FIG. 1, the power transmission equipment 575 is configured to manipulate (e.g., transform, invert, convert) the unmanipulated power 551 that it receives from the power generation sources 545. The power transmission equipment 575 is further configured to distribute the manipulated power 552 to the electrical load 589 in the field system 500.

In certain example embodiments, the one or more example power control systems 540 are configured to change one or more taps, in real time, within the power transmission equipment 575 so that the power transmission equipment 575 sends the manipulated power 552 to the electrical load 589 with characteristics (e.g., amount of real power, amount of imaginary power, frequency) that fall within acceptable operating ranges based on conditions at that particular point in time. By changing a tap of the power transmission equipment 575, the effective number of windings in a coil (e.g., for a transformer, for an inductor) of one or more phases of the manipulated power 552 is established.

As discussed above, the field system 500 may have any of a number (e.g., 1, 2, 5, 10) of example power control systems 540. In certain example embodiments, there is at least one power control system 540 for every phase (e.g., A phase, B phase, C phase, A-B phase, B-C phase, C-A phase) of unmanipulated power 551 and/or manipulated power 552. If a phase has multiple power control systems 540, one power control system 540 (or portions thereof) may be electrically coupled in series or in parallel with one or more of the other power control systems 540 (or portions thereof) for the phase. In some cases, part of a power control system 540 may directly affect the performance of more than one phase (rather than a single phase) of the power transmission equipment 575 at a point in time. A power control system 540 may be integrated into newly manufactured power transmission equipment 575 or retrofitted into existing power transmission equipment 575.

A power control system 540 may have any of a number (e.g., 1, 2, 5, 10, 25, 100, 500) of switches 541. When a power control system 540 has multiple switches 541, one switch 541 may be electrically in series and/or in parallel with one or more of the other switches 541 of the power control system 540. When a power control system 540 includes multiple switches 541, the configuration of one switch 541 may be the same as, or different than, the configuration of one or more of the other switches 541 of the power control system 540. Each switch 541 may be configured with extremely fast (e.g., a fraction of a cycle) operating or switching capability for dynamic voltage control. In addition, or in the alternative, each switch 541 may be configured to withstand high voltage and current density.

A switch 541 of a power control system 540 may have any of a number of formats. For example, a switch 541 may be or include a solid state on-load tap changer (SSOLTC). In such a case, the SSOLTC may be or include a silicone-carbine MOSFET. SSOLTCs may replace mechanical OLTCs currently used in the art with transformers and reactors, which thereby may eliminate the need for static VAR compensators (SVCs) and/or other solid-state controllers currently used in the art. Because of their fast switching speed, SSOLTCs may quickly control the system voltage directly when changing taps of a transformer and/or other components of the power transmission equipment 575. By contrast, SVCs and similar systems currently used in the art may only do so indirectly by controlling reactive load. The number of tap steps and tapping rate of change using SSOLTCs may allow for dV/dT control of the transformer secondary voltage or other system voltage. Similarly, SSOLTC in reactors may respond quickly to counteract fast changes in system real and/or reactive power flows. Switches 541 that are or include SSOLTCs may lack a diverter switch, as is commonly found in tap changers currently known in the art.

Design aspects of the SSOLTC controls, not found in OLTCs currently used in the art, may be implemented based on the electrical system needs. For example, a variable tap percent design may include multiple solid-state switches 541 with low voltage potential between each may allow for customizable tap steps. The percent change in voltage between tap steps may be varied by operating (e.g., turning on/off, opening/closing) multiple switches 541 simultaneously. Changing the tap percent may be used to alternate between a smoother and a more impactful response to system conditions.

As another example, an adaptive rate tapping design may change the operation (switching response) of the SSOLTCs (e.g., overall, between taps) based on system conditions. For example, a reduction or increase in the output of some or all of the power generation sources 545, a change in the number of parallel circuits of the electrical load 589, a change in the number of parallel transformers and/or other equipment of the power transmission equipment 575, loading or unloading large blocks of the electrical load 589, and other similar conditions within the field system 500 are conducive with the ability of the example power control system 540 to respond to such events using an adaptive tapping rate. As another example, the tapping rate may vary based on the amplitude and/or rate of change of over voltage and/or under voltage conditions. The number of taps in a SSOLTC may be selected, in part, to control the dV/dt between taps.

As another example, a point-on-wave tap control design may allow operation of the switches 541 at each phase at a desired voltage angle to reduce system transients. In any case, example power control systems 540 may incorporate these design aspects of the SSOLTCs to control voltage at one or multiple nodes of the power transmission equipment 575 and/or to control reactive power flowing in or out of nodes of the power transmission equipment 575.

Each sensor device 560 of a power control system 540 is configured to measure at least one parameter associated with the operation of the power transmission equipment 575. Each sensor device 560 includes one or more sensors that measure one or more parameters (e.g., temperature, humidity, real voltage, real power, reactive power, voltage magnitude and phase angle, current magnitude and phase angle, VAR, current, frequency, electrical demand, electrical usage). Examples of a sensor of a sensor device 560 may include, but are not limited to, a temperature sensor, an ammeter, a voltmeter, a VAR meter, a humidity sensor, an infrared sensor, and a camera. A sensor device 560 may measure a parameter in real time (e.g., continuously, instantaneously, periodically, randomly) or over a period of time (e.g., an hour, a day, a year). A sensor device 560 may measure a parameter based on an instruction from a controller 504 of the power control system 540, based on instructions from a user 550, based on the occurrence of an event (e.g., a passage of time, a change in demand of the electrical load 589), and/or based on some other factor.

A sensor device 560 may be used with respect to the power transfer links 587, the communication links 505, the electrical load 589, the power generation sources 545, and/or the power transmission equipment 575. In some cases, a number of sensor devices 560, each measuring a different parameter, may be used in combination to determine and confirm whether a controller 504 of the power control system 540 should take a particular action (e.g., operate one or more switches 541 of the power control system 540, operate one or more switches (e.g., switches 541-N) of another power control system (e.g., power control system 540-N)). When a sensor device 560 includes its own controller 504 (or portions thereof), then the sensor device 560 may be considered a type of computer device, as discussed below with respect to FIG. 9.

A controller 504 of a power control system 540 communicates with and in some cases controls one or more of the other components (e.g., a sensor device 560, a switch 541) of the power control system 540 and/or of another power control system (e.g., power control system 540-N). A controller 504 performs any of a number of functions that include obtaining and sending data, evaluating data, following protocols, running algorithms, and sending commands. A controller 504 may include one or more of a number of components. As discussed below with respect to FIG. 8, such components of a controller 504 may include, but are not limited to, a control engine, an analysis module, a communication module, a timer, a power module, a storage repository, a hardware processor, memory, a transceiver, an application interface, and a security module.

When a power control system 540 includes multiple controllers 504, each controller 504 may operate independently of each other. Alternatively, two or more of the multiple controllers 504 of a power control system 540 may work cooperatively with each other. As yet another alternative, one of the controllers 504 of a power control system 540 may control some or all of one or more other controllers 504 in the power control system 540. Each controller 504 may be considered a type of computer device, as discussed below with respect to FIG. 9.

Each of the controllers 404 of the field system 500 is a device or component that controls a portion (e.g., a communication network, some of the electrical load 589, one or more of the power generation sources 545) of the field system 500. A controller 404 may be substantially similar to some or all of a controller 504 of a power control system 540. For example, a controller 404 may include a controller that has one or more components (e.g., a transceiver, a control engine, a timer, a storage repository) and/or similar functionality to some or all of a controller 504 of a power control system 540. Alternatively, a controller 404 may include one or more of a number of features in addition to, or altered from, the features of a controller 504 of a power control system 540. As described herein, control and/or communication with a controller 404 may include communicating with one or more other components of the same field system 500 and/or another system. In such a case, a controller 404 may facilitate such control and/or communication. Each controller 404 may be considered a type of computer device, as discussed below with respect to FIG. 9.

When there are multiple controllers 404 (e.g., one controller 404 for one or more power generation sources 545, another controller 404 for some or all of the electrical load 589) in the field system 500, each controller 404 may operate independently of each other. Alternatively, two or more of the multiple controllers 404 may work cooperatively with each other. As yet another alternative, one of the controllers 404 may control some or all of one or more other controllers 404 in the field system 500. Each controller 404 may be considered a type of computer device, as discussed below with respect to FIG. 9.

Each sensor device 460 of the field system 500 is configured to measure at least one parameter associated with an aspect of the field system 500 that is not directly related to the operation to tap changing of the power transmission equipment 575 using one or more of the example power control systems 540. Each sensor device 460 includes one or more sensors that measure one or more parameters (e.g., temperature, humidity, fluid flow, pressure, real voltage, VAR, current, frequency, electrical demand, electrical usage). Examples of a sensor of a sensor device 460 may include, but are not limited to, a temperature sensor, an ammeter, a voltmeter, a VAR meter, a humidity sensor, an infrared sensor, and a camera. A sensor device 460 may measure a parameter in real time (e.g., continuously, instantaneously, periodically, randomly) over a period of time (e.g., a minute, an hour, a day, a week, a year, variable amounts of time). A sensor device 460 may measure a parameter based on an instruction from a controller 504 of the power control system 540, based on instructions from a user 550, based on another controller 404 of the field system 500, based on the occurrence of an event (e.g., a passage of time, a change in demand of the electrical load 589), and/or based on some other factor.

A sensor device 460 may be used with respect to the power transfer links 587, the communication links 505, the electrical load 589, the power generation sources 545, the power transmission equipment 575, and/or some other component of the field system 500. In some cases, a number of sensor devices 460, each measuring a different parameter, may be used in combination to determine and confirm whether a controller 404 of the field system 500 should take a particular action. When a sensor device 460 includes its own controller 404 (or portions thereof), then the sensor device 460 may be considered a type of computer device, as discussed below with respect to FIG. 9.

A user 550 may be any person that interacts, directly or indirectly, with the network manager 580, a controller 404, a sensor device 460, the electrical load 589, the power transmission equipment 575, the power generation sources 545, the example power control systems 540 (including one or more components thereof), and/or any other component of the field system 500. Examples of a user 550 may include, but are not limited to, a business owner, a user system 555 (e.g., in the context of artificial intelligence), an engineer, a company representative, a field operator, a consultant, a control room operator, a contractor, and a manufacturer's representative. A user 550 may use one or more user systems 555, which may include a display (e.g., a GUI). A user system 555 of a user 550 may interact with (e.g., send data to, obtain data from) a controller 404 via an application interface and using the communication links 505. The user 550 may also interact directly with a controller (e.g., a controller 404, a controller 504 of a power control system 540) through a user interface (e.g., keyboard, mouse, touchscreen).

The network manager 580 is a device or component that controls all or a portion (e.g., an example power control system 540, a controller 404) of the field system 500. The network manager 580 may be substantially similar to a controller 404, as described above. For example, the network manager 580 may include a controller that has one or more components and/or similar functionality to some or all of the controller 404. Alternatively, the network manager 580 may include one or more of a number of features in addition to, or altered from, the features of a controller 404. As described herein, control and/or communication with the network manager 580 may include communicating with one or more other components of the same field system 500 or another system. In such a case, the network manager 580 may facilitate such control and/or communication. The network manager 580 may be called by other names, including but not limited to a master controller, a network controller, a gateway, and an enterprise manager. The network manager 580 may be considered a type of computer device, as discussed below with respect to FIG. 9.

Interaction between each controller 404, the sensor devices 460, the users 550 (including any associated user systems 555), the network manager 580, each power control system 540, the power transmission equipment 575, and other components (e.g., the electrical load 589, the power generation sources 545) of the field system 500 may be conducted using communication links 505 and/or power transfer links 587. Each communication link 505 may include wired (e.g., Class 1 electrical cables, Class 2 electrical cables, Class 3 electrical cables, electrical connectors, Power Line Carrier, RS485) and/or wireless (e.g., Wi-Fi, Zigbee, visible light communication, cellular networking, Bluetooth, Bluetooth Low Energy (BLE), ultrawide band (UWB), WirelessHART, ISA100) technology. A communication link 505 may transmit signals (e.g., communication signals, control signals, data) between each controller 404, the sensor devices 460, the users 550 (including any associated user systems 555), the network manager 580, the example power control systems 540, the power transmission equipment 575, and the other components of the field system 500. The power transfer links 587 may be substantially the same as the power transfer links discussed above with respect to FIGS. 1 through 4.

Figure 6:
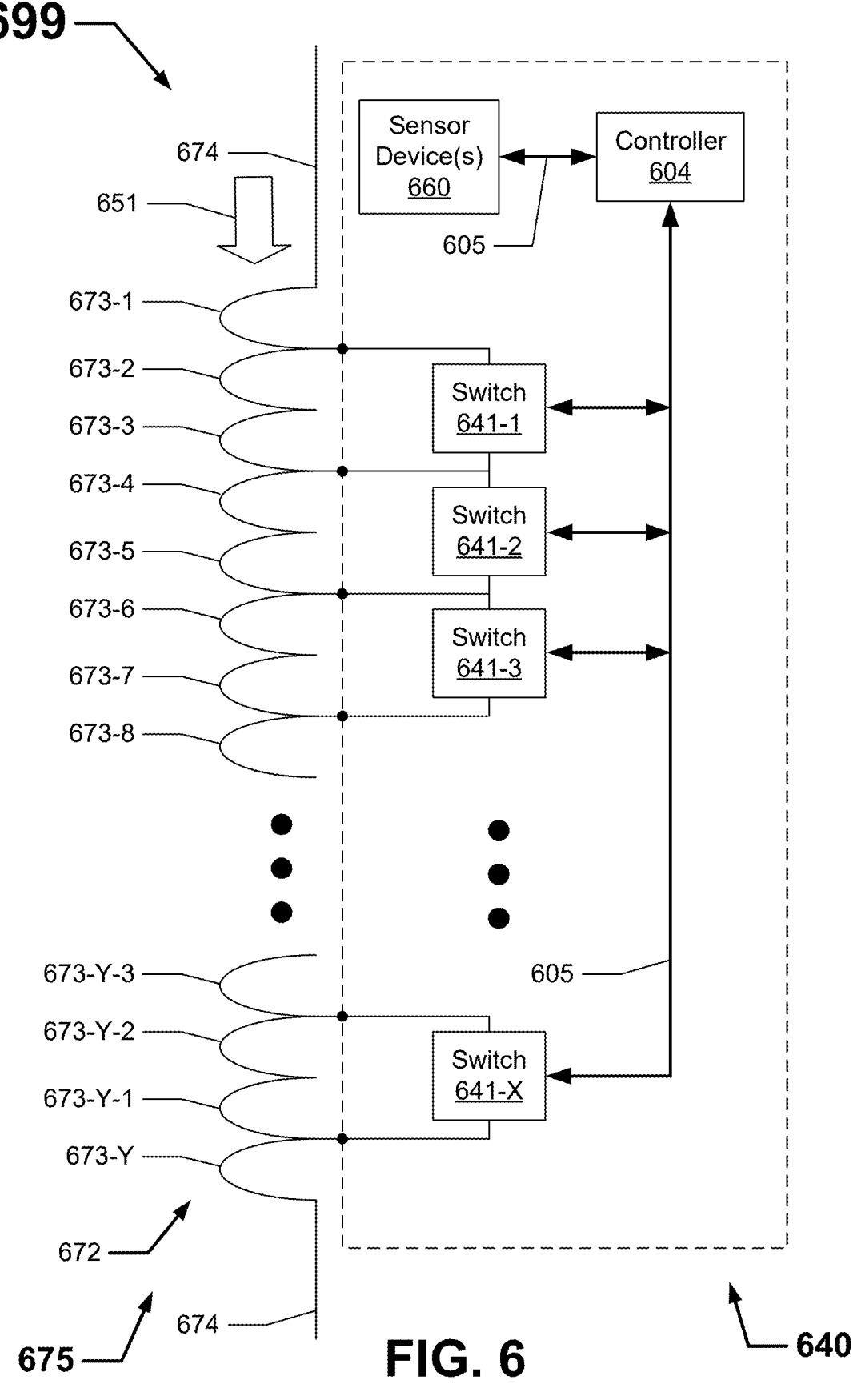
FIG. 6 shows a detailed view of a subsystem that includes an example power control system and a phase of power transmission equipment according to certain example embodiments.

FIG. 6 shows a detailed view of a subsystem 699 that includes an example power control system 640 and a phase of power transmission equipment 675 according to certain example embodiments. Referring to the description with respect to FIGS. 1 through 5 above, the subsystem 699 of FIG. 6 includes a phase of power transmission equipment 675 (e.g., a transformer) and an example power control system 640. The power transmission equipment 675 and the power control system 640 of the subsystem 699 of FIG. 6 are substantially the same as the power transmission equipment and the power control systems discussed above.

In this example, the phase of the power transmission equipment 675 includes a coil 672 with Y windings 673 (winding 673-1 through winding 673-Y) with a non-coiled conductor 674 on both sides of the coil 672. The windings 673 of the coil 672 and the conductors 674 are electrically conductive and form a continuous path through which current (e.g., from the unmanipulated power 651) may flow. Integrated with a number of the windings 673 are X switches 641 (switch 641-1 through switch 641-X) of the power control system 640. The switches 641 are substantially similar to the switches 541 discussed above with respect to FIG. 5. The windings 673 may be substantially uniform (e.g., in terms of thickness, in terms of material, in terms of shape, in terms of length, in terms of curvature) with respect to each other. In this example, the coil 672 is on the primary side of a transformer of the power transmission equipment 675, and so unmanipulated power 651 flows through the coil 672.

In this case, each switch 641 is electrically coupled in parallel with two or more adjacent windings 673. For example, switch 641-1 is electrically coupled in parallel with winding 673-2 and winding 673-3. As another example, switch 641-2 is electrically coupled in parallel with winding 673-4 and winding 673-5. As yet another example, switch 641-3 is electrically coupled in parallel with winding 673-6 and winding 673-7. As still another example, switch 641-X is electrically coupled in parallel with winding 673-Y−2 and winding 673-Y−1. The location of each switch 641 within the coil 672 or a winding 673 thereof may be based on one or more of a number of factors, including but not limited to system needs and equipment capabilities.

In certain example embodiments, the characteristics (e.g., in terms of configuration, in terms of material, in terms of nameplate rating) of one of the switches 641 is substantially the same as the corresponding characteristics of one or more of the other switches 641. In alternative embodiments, a switch 641 may be electrically coupled in parallel with a single winding 673 or with more than two windings 673. In alternative embodiments, the number of windings 673 that one switch 641 of the power control system 640 is electrically coupled in parallel to may be different than the number of windings 673 that one or more of the other switches 641 of the power control system 640 is electrically coupled in parallel to.

As discussed above with respect to FIG. 5, a switch 641 may be any type of switch. For example, a switch 641 may be or include a silicone-carbine MOSFET. In certain example embodiments, a switch 641 is a solid state device that operates quickly (e.g., in less than one cycle) and with the ability to handle the amount of unmanipulated power 651 that may flow therethrough. One of the switches 641 of the power control system 640 may be of the same type or a different type compared to one or more of the other switches 641 of the power control system 640.

Each switch 641 of the power control system 640 has an open position and a closed position. When a switch 641 is in the open position, the unmanipulated power 651 does not flow through the switch 641 but instead flows through the winding(s) 673 to which the switch 641 is coupled in parallel. When a switch 641 is in the closed position, the unmanipulated power 651 flows through the switch 641, thereby bypassing the winding(s) 673 to which the switch 641 is coupled in parallel. The time that a switch 641 takes to operate (e.g., transition from one state (e.g., closed position) to the other state (e.g., open position)) may be relatively quick (e.g., a half cycle, a full cycle, three cycles).

As defined herein, the position of each switch 641 of the power control system 640 at a particular point in time is referred to as a configuration of the switches 641. For example, one configuration of the switches 641 is where all of the switches 641 are in the open position. As another example, another configuration of the switches 641 is where all of the switches 641 are in the closed position. As yet another example, yet another configuration of the switches 641 is where the first half of the switches 641 are in the closed position and the second half of the switches 641 are in the open position. When the power control system 640 has X switches 641 that are arranged in series with each other, as in this case, the number of different configurations of the switches 641 is $2^X$.

Figure 8:
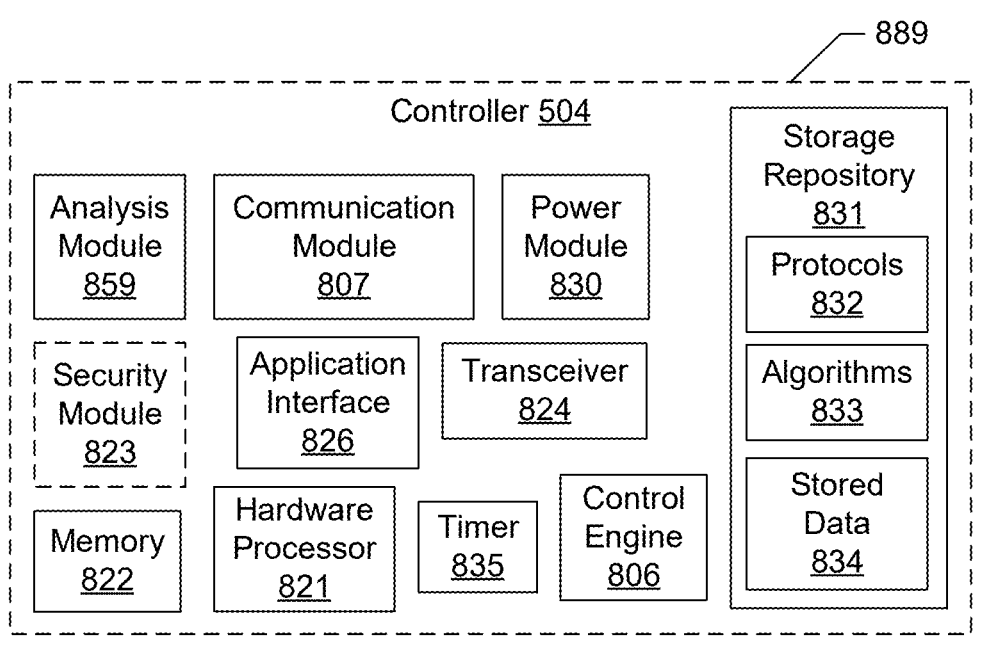
FIG. 8 shows a system diagram of a controller of an example power control system of FIG. 5 according to certain example embodiments.

Each switch 641 is communicably coupled to the controller 604 of the power control system 640. In this way, the controller 604 may operate each switch 641 individually so that, at any point in time, the controller 604 may establish the configuration of the switches 641. When transitioning from a current configuration of the switches 641 to a target configuration of the switches 641, the switching sequence (the sequence of operating the various switches 641) implemented by the controller 604 may overlap so that a minimal change in voltage (dV) is introduced. In some cases, the controller 604 may operate multiple switches 641 simultaneously. In certain example embodiments, the controller 604 may implement a point-on-wave control technology to reduce or eliminate transients by operating the switches 641 within the phase at a desired (target) voltage angle. Communication links 605, which are substantially similar to the communication links 505 discussed above, are used to facilitate communication between the controller 604 and the switches 641. The controller 604 is also communicably coupled to the one or more sensor devices 660. FIG. 8 below shows an example of a controller 504 of a power control system (e.g., power control system 540) that may be substantially similar to the controller 604 of the power control system 640 of FIG. 6.

The one or more sensor devices 660 of the power control system 640 are substantially the same as the sensor devices 560 discussed above with respect to FIG. 5. For example, each sensor device 660 of the power control system 640 is configured to measure at least one parameter associated with the operation of the power transmission equipment 675. Each sensor device 660 includes one or more sensors that measure one or more parameters (e.g., temperature, humidity, real voltage, VARs, current, frequency, electrical demand, electrical usage). Examples of a sensor of a sensor device 660 may include, but are not limited to, a temperature sensor, an ammeter, a voltmeter, a VAR meter, a humidity sensor, an infrared sensor, and a camera. A sensor device 660 may measure a parameter in real time (e.g., continuously, instantaneously, periodically, randomly) or over a period of time (e.g., an hour, a day, a year). A sensor device 660 may measure a parameter based on an instruction from the controller 604 of the power control system 640, based on instructions from a user (e.g., user 550), based on the occurrence of an event (e.g., a passage of time, a change in demand of the electrical load (electrical load 589)), and/or based on some other factor.

In this example, a sensor device 660 may be used with respect to measuring a parameter (e.g., frequency, real voltage, VARs, current) associated with the unmanipulated power 651 flowing through the conductor 674 and/or the coil 672 of the power transmission equipment 675. The measurements made by a sensor device 660 are obtained (e.g., instantaneously) by the controller 604 using the communication links 605. When the power control system 640 has multiple sensor devices 660, a sensor device 660 may measure a different parameter that may be used in combination with the parameters measured by the other sensor devices 660 to determine and confirm whether the controller 604 of the power control system 640 should take a particular action (e.g., change the configuration of the switches 641 by operating one or more switches 641 of the power control system 640). When a sensor device 660 includes its own controller (e.g., similar to some or all of controller 604), the sensor device 660 may be considered a type of computer device, as discussed below with respect to FIG. 9.

Figure 7:
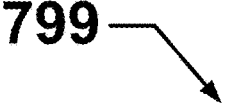
FIG. 7 shows a block diagram of a subsystem that includes multiple example power control systems and multiple phases of power transmission equipment according to certain example embodiments.

FIG. 7 shows a block diagram of a subsystem 799 that includes multiple example power control systems 740 and multiple phases of power transmission equipment 775 according to certain example embodiments. Referring to the description with respect to FIGS. 1 through 6 above, the subsystem 799 of FIG. 7 includes Y phases of power transmission equipment 775 (e.g., a transformer) and N example power control systems 740 (power control system 740-1 through power control system 740-N). The power transmission equipment 775 and the power control systems 740 of the subsystem 799 of FIG. 7 are substantially the same as the power transmission equipment and the power control systems discussed above.

In this example, phase 1 (e.g., A-phase) of the power transmission equipment 775 includes a coil 772-1 with A windings 773-1 (winding 773-1-1 through winding 773-1-A) with a non-coiled conductor 774-1 on both sides of the coil 772-1. The windings 773-1 of the coil 772-1 and the conductors 774-1 are electrically conductive and form a continuous path through which current (e.g., from the manipulated power 752) may flow. Integrated with a number of the windings 773-1 are D switches 741-1 (switch 741-1-1 through switch 741-1-D) of the power control system 740-1. The switches 741-1 are substantially similar to the switches 541 discussed above with respect to FIG. 5. The windings 773-1 may be substantially uniform (e.g., in terms of thickness, in terms of material, in terms of shape, in terms of length, in terms of curvature) with respect to each other. In this example, the coil 772-1 is on the secondary side of a transformer of the power transmission equipment 775, and so manipulated power 752 flows through the coil 772-1. If the transformer (or other form of power transmission equipment 775) has a tertiary winding and/or other winding, one or more example power control systems 740 may be used with such tertiary and/or other windings.

Also in this example, phase Y (e.g., C-phase) of the power transmission equipment 775 includes a coil 772-Y with B windings 773-Y (winding 773-Y–1 through winding 773-Y-B) with a non-coiled conductor 774-Y on both sides of the coil 772-Y. The windings 773-Y of the coil 772-Y and the conductors 774-Y are electrically conductive and form a continuous path through which current (e.g., from the manipulated power 752) may flow. Integrated with a number of the windings 773-Y are E switches 741-N (switch 741-N–1 through switch 741-N-E) of the power control system 740-N. The switches 741-N are substantially similar to the switches 541 discussed above with respect to FIG. 5. The windings 773-Y may be substantially uniform (e.g., in terms of thickness, in terms of material, in terms of shape, in terms of length, in terms of curvature) with respect to each other. In this example, the coil 772-Y is also on the secondary side of the transformer of the power transmission equipment 775, and so manipulated power 752 flows through the coil 772-Y.

The number of windings 773 (e.g., windings 773-1) of one phase may be the same as, or different than, the number of windings 773 (e.g., windings 773-Y) of one or more of the other phases. Similarly, one or more other characteristics (e.g., thickness, material, shape, length, curvature) of the windings 773 (e.g., windings 773-1) of one phase may be the same as, or different than, the corresponding characteristics of the windings 773 (e.g., windings 773-Y) of one or more of the other phases. In this case, each switch 741-1 of the power control system 740-1 is electrically coupled in parallel with a single adjacent winding 773-1 of the coil 772-1. For example, switch 741-1-1 of the power control system 740-1 is electrically coupled in parallel with winding 773-1-1. As another example, switch 741-1-D is electrically coupled in parallel with winding 773-1-A.

In certain example embodiments, the characteristics (e.g., in terms of configuration, in terms of material, in terms of nameplate rating) of one of the switches 741-1 of the power control system 740-1 is substantially the same as the corresponding characteristics of one or more of the other switches 741-1 of the power control system 740-1. In alternative embodiments, a switch 741-1 may be electrically coupled in parallel with two or more windings 773-1. In alternative embodiments, the number of windings 773-1 that one switch 741-1 of the power control system 740-1 is electrically coupled in parallel to may be different than the number of windings 773-1 that one or more of the other switches 741-1 of the power control system 740-1 is electrically coupled in parallel to.

As discussed above with respect to FIG. 5, a switch 741-1 of the power control system 740-1 may be any type of switch. For example, a switch 741-1 of the power control system 740-1 may be or include a silicone-carbine MOS-FET. In certain example embodiments, a switch 741-1 of the power control system 740-1 is a solid state device that operates quickly (e.g., in less than one cycle) and with the ability to handle the amount of manipulated power 752 that may flow therethrough. One of the switches 741-1 of the power control system 740-1 may be of the same type or a different type compared to one or more of the other switches 741-1 of the power control system 740-1.

Each switch 741-1 of the power control system 740-1 has an open position and a closed position. When a switch 741-1 is in the open position, the manipulated power 752 does not flow through the switch 741-1 but instead flows through the winding 773-1 to which the switch 741-1 is coupled in parallel. When a switch 741-1 is in the closed position, the manipulated power 752 flows through the switch 741-1, thereby bypassing the winding 773-1 to which the switch 741-1 is coupled in parallel. The time that a switch 741-1 takes to operate (e.g., transition from one state (e.g., closed position) to the other state (e.g., open position)) may be relatively quick (e.g., a half cycle, a full cycle, three cycles). As discussed above, as defined herein, the position of each switch 741-1 of the power control system 740-1 at a particular point in time is referred to as a configuration of the switches 741-1. The location of each switch 741-1 within the coil 772-1 or a winding 773-1 thereof may be based on one or more of a number of factors, including but not limited to system needs and equipment capabilities.

Each switch 741-1 is communicably coupled to the controller 704-1 of the power control system 740-1. In this way, the controller 704-1 may operate each switch 741-1 individually so that, at any point in time, the controller 704-1 may establish the configuration of the switches 741-1. When transitioning from a current configuration of the switches 741-1 to a target configuration of the switches 741-1, the switching sequence (the sequence of operating the various switches 741-1) established by the controller 704-1 may overlap so that a minimal change in voltage (dV) is introduced. In some cases, the controller 704-1 may operate multiple switches 741-1 simultaneously. In certain example embodiments, the controller 704-1 may implement a pointon-wave control technology to reduce or eliminate transients by operating the switches 741-1 within the phase at a desired (target) voltage angle. Communication links 705, which are substantially similar to the communication links 505 discussed above, are used to facilitate communication between the controller 704-1 and the switches 741-1. The controller 704-1 is also communicably coupled to the one or more sensor devices 760-1 of the power control system 740-1. FIG. 8 below shows an example of a controller 504 of a power control system (e.g., power control system 540) that may be substantially similar to the controller 704-1 of the power control system 740-1 of FIG. 7.

The one or more sensor devices 760-1 of the power control system 740-1 are substantially the same as the sensor devices 560 discussed above with respect to FIG. 5. For example, each sensor device 760-1 of the power control system 740-1 is configured to measure at least one parameter associated with the phase of the operation of the power transmission equipment 775. Each sensor device 760-1 includes one or more sensors that measure one or more parameters (e.g., temperature, humidity, real voltage, VARs, current, frequency, electrical demand, electrical usage). Examples of a sensor of a sensor device 760-1 may include, but are not limited to, a temperature sensor, an ammeter, a voltmeter, a VAR meter, a humidity sensor, an infrared sensor, and a camera. A sensor device 760-1 may measure a parameter in real time (e.g., continuously, instantaneously, periodically, randomly) or over a period of time (e.g., an hour, a day, a year). A sensor device 760-1 may measure a parameter based on an instruction from the controller 704-1 of the power control system 740-1, based on instructions from a user (e.g., user 550), based on the occurrence of an event (e.g., a passage of time, a change in demand of the electrical load (electrical load 589)), and/or based on some other factor.

In this example, a sensor device 760-1 may be used with respect to measuring a parameter (e.g., frequency, real voltage, VARs, current) associated with the manipulated power 752 flowing through the conductor 774-1 and/or the coil 772-1 of the power transmission equipment 775. The measurements made by a sensor device 760-1 are obtained (e.g., instantaneously) by the controller 704-1 using the communication links 705. When the power control system 740-1 has multiple sensor devices 760-1, a sensor device 760-1 may measure a different parameter that may be used in combination with the parameters measured by the other sensor devices 760-1 to determine and confirm whether the controller 704-1 of the power control system 740-1 should take a particular action (e.g., change the configuration of the switches 741-1 by operating one or more switches 741-1 of the power control system 740-1). When a sensor device 760-1 includes its own controller (e.g., similar to some or all of controller 704-1), the sensor device 760-1 may be considered a type of computer device, as discussed below with respect to FIG. 9.

Also in this case, each switch 741-N of the power control system 740-N is electrically coupled in parallel with a single adjacent winding 773-Y of the coil 772-Z. For example, switch 741-N–1 of the power control system 740-N is electrically coupled in parallel with winding 773-Y–1. As another example, switch 741-N-E is electrically coupled in parallel with winding 773-Y-B. In certain example embodiments, the characteristics (e.g., in terms of configuration, in terms of material, in terms of nameplate rating) of one of the switches 741-N of the power control system 740-N is substantially the same as the corresponding characteristics of one or more of the other switches 741-N of the power control system 740-N. In alternative embodiments, a switch 741-N may be electrically coupled in parallel with two or more windings 773-Y. In alternative embodiments, the number of windings 773-Y that one switch 741-N of the power control system 740-N is electrically coupled in parallel to may be different than the number of windings 773-Y that one or more of the other switches 741-N of the power control system 740-N is electrically coupled in parallel to.

As discussed above with respect to FIG. 5, a switch 741-N of the power control system 740-N may be any type of switch. For example, a switch 741-N of the power control system 740-N may be or include a silicone-carbine MOS-FET. In certain example embodiments, a switch 741-N of the power control system 740-N is a solid state device that operates quickly (e.g., in less than one cycle) and with the ability to handle the amount of manipulated power 752 that may flow therethrough. One of the switches 741-N of the power control system 740-N may be of the same type or a different type compared to one or more of the other switches 741-N of the power control system 740-N.

Each switch 741-N of the power control system 740-N has an open position and a closed position. When a switch 741-N is in the open position, the manipulated power 752 does not flow through the switch 741-N but instead flows through the winding 773-Y to which the switch 741-N is coupled in parallel. When a switch 741-N is in the closed position, the manipulated power 752 flows through the switch 741-N, thereby bypassing the winding 773-Y to which the switch 741-N is coupled in parallel. The time that a switch 741-N takes to operate (e.g., transition from one state (e.g., closed position) to the other state (e.g., open position)) may be relatively quick (e.g., a half cycle, a full cycle, three cycles). As discussed above, as defined herein, the position of each switch 741-N of the power control system 740-N at a particular point in time is referred to as a configuration of the switches 741-N. When transitioning from a current configuration of the switches 741-N to a target configuration of the switches 741-N, the switching sequence (the sequence of operating the various switches 741-N) may overlap so that a minimal change in voltage (dV) is introduced.

Each switch 741-N of the power control system 740-N is communicably coupled to the controller 704-N of the power control system 740-N. In this way, the controller 704-N may operate each switch 741-N individually so that, at any point in time, the controller 704-N may establish the configuration of the switches 741-N. When transitioning from a current configuration of the switches 741-N to a target configuration of the switches 741-N, the switching sequence (the sequence of operating the various switches 741-N) implemented by the controller 704-N may overlap so that a minimal change in voltage (dV) is introduced. In some cases, the controller 704-N may operate multiple switches 741-N simultaneously. In certain example embodiments, the controller 704-N may implement a point-on-wave control technology to reduce or eliminate transients by operating the switches 741-N within the phase at a desired (target) voltage angle. Communication links 705 are used to facilitate communication between the controller 704-N and the switches 741-N. The controller 704-N is also communicably coupled to the one or more sensor devices 760-N of the power control system 740-N. FIG. 8 below shows an example of a controller 504 of a power control system (e.g., power control system 540) that may be substantially similar to the controller 704-N of the power control system 740-N of FIG. 7.

The configuration (e.g., number, type, electrical connection) of the switches 741 of one phase (e.g., switches 741-1)

may be the same as, or different than, some or all of the configuration of the switches 741 of another phase (e.g., switches 741-Y). In some cases, a switch 741 may be electrically coupled to one or more windings 773 of multiple coils 772. For example, switch 741-1-1 may be electrically coupled to winding 773-1-1 of coil 772-1 and to winding 773-Y–1 of coil 772-Y. The location of each switch 741-N within the coil 772-Y or a winding 773-Y thereof may be based on one or more of a number of factors, including but not limited to system needs and equipment capabilities.

The one or more sensor devices 760-N of the power control system 740-N are substantially the same as the sensor devices 560 discussed above with respect to FIG. 5. For example, each sensor device 760-N of the power control system 740-N is configured to measure at least one parameter associated with the Y phase of the operation of the power transmission equipment 775. Each sensor device 760-N includes one or more sensors that measure one or more parameters (e.g., temperature, humidity, real voltage, VARs, current, frequency, electrical demand, electrical usage). Examples of a sensor of a sensor device 760-N may include, but are not limited to, a temperature sensor, an ammeter, a voltmeter, a VAR meter, a humidity sensor, an infrared sensor, and a camera. A sensor device 760-N may measure a parameter in real time (e.g., continuously, instantaneously, periodically, randomly) or over a period of time (e.g., an hour, a day, a year). A sensor device 760-N may measure a parameter based on an instruction from the controller 704-N of the power control system 740-N, based on instructions from a user (e.g., user 550), based on the occurrence of an event (e.g., a passage of time, a change in demand of the electrical load (electrical load 589)), and/or based on some other factor.

In this example, a sensor device 760-N may be used with respect to measuring a parameter (e.g., frequency, real voltage, VARs, current) associated with the manipulated power 752 flowing through the conductor 774-Y and/or the coil 772-Y of the power transmission equipment 775. The measurements made by a sensor device 760-N are obtained (e.g., instantaneously) by the controller 704-N using the communication links 705. When the power control system 740-N has multiple sensor devices 760-N, a sensor device 760-N may measure a different parameter that may be used in combination with the parameters measured by the other sensor devices 760-N to determine and confirm whether the controller 704-N of the power control system 740-N should take a particular action (e.g., change the configuration of the switches 741-N by operating one or more switches 741-N of the power control system 740-N). When a sensor device 760-N includes its own controller (e.g., similar to some or all of controller 704-N), the sensor device 760-N may be considered a type of computer device, as discussed below with respect to FIG. 9.

In some cases, the multiple power control systems 740 (e.g., power control system 740-1, power control system 740-Y) may be merged into a single power control system 740. In such cases, the single power control system 740 may have a single controller 704 that controls all of the switches 741 of all of the phases. Alternatively, the single power control system 740 may have multiple controllers 704 that work in collaboration with each other and/or in a hierarchical arrangement with respect to each other. In addition, or in the alternative, a single power control system 740 may have a single sensor device 760 that is configured to measure one or more parameters for multiple phases of the power transmission equipment 775.

FIG. 8 shows a system diagram of a controller 504 of an example power control system 540 of FIG. 5 according to certain example embodiments. Referring to the description with respect to FIGS. 1 through 7 above, the controller 504 may be one of the controllers 504 discussed above with respect to FIG. 3. The controller 504 includes multiple components. In this case, the controller 504 of FIG. 5 includes a control engine 806, an analysis module 859, a communication module 807, a timer 835, a power module 830, a storage repository 831, a hardware processor 821, a memory 822, a transceiver 824, an application interface 826, and, optionally, a security module 823. A controller 504 (or components thereof) may be located at or near the various components of an example power control system 540. In addition, or in the alternative, the controller 504 (or components thereof) may be located remotely from (e.g., in the cloud, at an office building) the various components of an example power control system 540.

The controller 504 may include an optional housing 889. The housing 889 may include at least one wall that forms a cavity. In some cases, the housing 889 may be designed to comply with any applicable standards so that the controller 504 may be located in a particular environment (e.g., outdoors, high humidity, high and/or low temperatures). The housing 889 of the controller 504 may be used to house one or more components of the controller 504. In alternative embodiments, any one or more of these or other components of the controller 504 may be disposed on the housing 889 and/or remotely from the housing 889. For instance, the transceiver 824 of the controller 504 may include an antenna that is disposed on the housing 889. As another example, part of the storage repository 831 of the controller 504 may be located remotely from the housing 889 of the controller 504.

The storage repository 831 may be a persistent storage device (or set of devices) that stores software and data used to assist the controller 504 in communicating with one or more other components of a system, such as the users 550 (including associated user systems 555), the power transmission equipment 575, the power generation sources 545, the electrical load 589, the network manager 580, the controllers 404, the sensor devices 460, and the sensor devices 460. In one or more example embodiments, the storage repository 831 stores one or more protocols 832, one or more algorithms 833, and stored data 834.

The protocols 832 of the storage repository 831 may be any procedures (e.g., a series of method steps) and/or other similar operational processes that the control engine 806 of the controller 504 follows based on certain conditions at a point in time. The protocols 832 may include any of a number of communication protocols that are used to send and/or obtain data between the controller 504 and other components of the field system 500. Such protocols 832 used for communication may be time-synchronized protocols. Examples of such time-synchronized protocols may include, but are not limited to, a highway addressable remote transducer (HART) protocol, a wirelessHART protocol, and an International Society of Automation (ISA) 100 protocol. In this way, one or more of the protocols 832 may provide a layer of security to the data transferred within a system (e.g., the system 300). Other protocols 832 used for communication may be associated with the use of Wi-Fi, Zigbee, visible light communication (VLC), cellular networking, BLE, UWB, and Bluetooth.

The algorithms 833 may be any formulas, mathematical models, forecasts, simulations, and/or other similar tools that the control engine 806 of the controller 504 uses to reach a computational conclusion. For example, one or more algorithms 833 may be used, in conjunction with one or more protocols 832, to assist the controller 504 to obtain a measurement of the parameter associated with power (e.g., unmanipulated power 551, manipulated power 552) flowing through a phase of the power transmission equipment 575 from a sensor device 560 at a point in time. As another example, one or more algorithms 833 may be used, in conjunction with one or more protocols 832, to assist the controller 504 to determine what configuration that the switches 541 of an example power control system 540 should change to, how quickly that change should occur, and which of the switches 541 need to be operated to achieve the new configuration. As another example, one or more algorithms 833 and one or more protocols 832, in conjunction with measurements made by one or more sensor devices 460, may be used to assist the controller 504 in determining that a parameter measured by a sensor device 560 falls outside an acceptable operating range based on a current configuration of the switches 541 of an example power control system 540.

Further, one or more algorithms 833 and one or more protocols 832, in conjunction with measurements made by one or more sensor devices 460, may be used to assist the controller 504 in identifying a target configuration of the switches 541 that, when implemented, results in the parameter returning to the acceptable operating range. Also, one or more algorithms 833 and one or more protocols 832, in conjunction with measurements made by one or more sensor devices 460, may be used to assist the controller 504 in operate one or more of the switches 541 to achieve the target configuration at a point in time.

Further, one or more algorithms 833 and one or more protocols 832, in conjunction with measurements made by one or more sensor devices 460, may be used to assist the controller 504 in determining when to send a notification to a user 550. As another example, one or more algorithms 833 may be used, in conjunction with one or more protocols 832, to assist the controller 504 to determine when to have a sensor device 460 measure a parameter and subsequently perform a calculation or make a determination using the measurement. As yet another example, one or more algorithms 833 may be used, in conjunction with one or more protocols 832 and measurements made by one or more of the sensor devices 460, to assist the controller 504 to determine when and to what extent to adjust a range of acceptable values for a parameter.

An algorithm 833 may be or be based on machine learning and/or an analytical model. For example, the control engine 806 of the controller 504, through the use of one or more protocols 832 and/or one or more algorithms 833, may implement machine learning as a way to evolve over time with new data and associated changes that may result from the new data. The control engine 806 may use, for example, supervised learning, unsupervised learning, semi-supervised learning, and/or reinforcement learning, as those terms are known in the art of machine learning. In this case, these types of machine learning are effective with sufficient data (e.g., measurements from sensor devices 560) and use of algorithms 833 and/or protocols 832 that automatically build mathematical models using sample data—also known as "training data".

In this way, for example, the controller 504 may measure and interpret the measurements of one or more parameters associated with the electrical power and/or operation of the power control systems 540 in order to establish baselines, compare subsequent data to baselines, adjust baselines, perform retroactive analysis, assess the state of one or more of the switches 541 in real time, recommend a change in the state of one or more of the switches 541 in real time, etc., using data and language elements native to the controller 504. Using this flexibility allowed by the learning protocols 832 and/or algorithms 833, the controller 504 may scale to disparate vendor solutions and 'build' asset development optimization scenarios and recommendations. The learning protocols 832 and/or algorithms 833 may use or include large language models (LLM) to implement unique classification/semantic matching properties that may assist in the development of asset optimization by the controller 504.

The learning protocols 832 and/or algorithms 833 that may be used and trained by the control engine 806 may include, but are not limited to, instance-based learning algorithms, artificial neural network algorithms, deep learning algorithms, and ensemble algorithms. Instance-based learning algorithms typically build up a database of example data and compare new data to the database using a similarity measure in order to find the best match and make a prediction. For this reason, instance-based methods are also called winner-take-all methods and memory-based learning. Focus may be put on the representation of the stored instances and similarity measures used between instances. Instance-based algorithms may be computationally expensive for very large datasets since they save all training instances/data points and are sensitive to data noise.

Artificial neural networks may be fairly similar to the human brain. For example, artificial neural networks may be made up of artificial neurons, take in multiple inputs, and produce specific outputs. Artificial neural networks may be an enormous subfield comprised of a large number of neural network architectures and hundreds of algorithms and variations for different types of problems. Artificial neural networks may be biologically inspired computational simulations for certain specific tasks like clustering, classification, or pattern recognition.

Deep learning algorithms may be a modern update to artificial neural networks by building much larger and more complex neural networks. With deep learning, many methods may be applied to very large datasets. Various architectures may be applied for deep learning algorithms. Deep learning may have a high computational cost because much of its development requires advanced processing, storage hardware, and ML platforms/APIs.

Ensemble algorithm methods may be models composed of multiple weaker models that are independently trained and whose predictions are combined in some way to make the overall prediction. Various combination techniques (e.g., averaging, max voting, bagging/bootstrapping (sampling subsets of original complete dataset), boosting) may be applied. Unlike other standard ensemble methods where models are trained in isolation, the boosting technique may employ an iterative approach, training models in succession, with each new model being trained to correct the errors made by the previous ones. Models may be added sequentially until no further improvements may be made.

Stored data 834 may be any data associated with a field operation, nameplate data for components (e.g., the power transmission equipment 575, the power generation sources 545, the electrical load 589, the sensor devices 460, the power control systems 540), including portions thereof, of the field system 500, measurements made by the sensor devices 460, measurements made by the sensor devices 560, threshold values, ranges of acceptable values, tables, results of previously run or calculated algorithms 833, updates to protocols 832, user preferences, current and historical configurations of switches 541, and/or any other suitable data. Such data may be any type of data, including but not limited to historical data, present data, and future data (e.g., fore-casts). The stored data 834 may be associated with some measurement of time derived, for example, from the timer 835.

Examples of a storage repository 831 may include, but are not limited to, a database (or a number of databases), a file system, cloud-based storage, a hard drive, flash memory, some other form of solid-state data storage, or any suitable combination thereof. The storage repository 831 may be located on multiple physical machines, each storing all or a portion of the communication protocols 832, the algorithms 833, and/or the stored data 834 according to some example embodiments. Each storage unit or device may be physically located in the same or in a different geographic location.

The storage repository 831 may be operatively connected to the control engine 806. In one or more example embodi-ments, the control engine 806 includes functionality to communicate with the users 550 (including associated user systems 555), the sensor devices 460, the sensor devices 560 of the power control systems 540, the controllers 404, the other controllers 504 of the power control systems 540, the network manager 580, and the other components in the field system 500. More specifically, the control engine 806 sends information to and/or obtains information from the storage repository 831 in order to communicate with the users 550 (including associated user systems 555), the sensor devices 460, the sensor devices 560 of the power control systems 540, the controllers 404, the other controllers 504 of the power control systems 540, the network manager 580, and the other components of the field system 500. As discussed below, the storage repository 831 may also be operatively connected to the communication module 807 in certain example embodiments.

In certain example embodiments, the control engine 806 of a controller 504 controls the operation of one or more components (e.g., the communication module 807, the timer 835, the transceiver 824) of the controller 504. For example, the control engine 806 may activate the communication module 807 when the communication module 807 is in "sleep" mode and when the communication module 807 is needed to send data obtained from another component (e.g., a sensor device 560) of the power control system 540, or more broadly, of the field system 500. In addition, in some cases, the control engine 806 of a controller 504 may control the operation of one or more other components (e.g., the power transmission equipment 575, the power generation sources 545, the electrical load 589), or portions thereof, of the field system 500.

The control engine 806 of the controller 504 may com-municate with one or more other components of the field system 500. For example, the control engine 806 may use one or more protocols 832 to facilitate communication with the sensor devices 460 to obtain data (e.g., measurements of various parameters, such as voltage, current, electrical demand, electrical usage, temperature, humidity), whether in real time or on a periodic basis and/or to instruct a sensor device 460 to take a measurement. A number of these and other capabilities of the control engine 806 (as well as the controller 504 as a whole) are discussed below with respect to FIG. 10.

The control engine 806 may generate and process data associated with control, communication, and/or other sig-nals sent to and obtained from the users 550 (including associated user systems 555), the sensor devices 460, the sensor devices 560 of the power control systems 540, the controllers 404, the other controllers 504 of the power control systems 540, the network manager 580, and the other components of the field system 500. In certain embodiments, the control engine 806 of the controller 504 may commu-nicate with one or more components of a system external to the field system 500. For example, the control engine 806 may interact with an inventory management system by ordering replacements for components or pieces of equip-ment (e.g., a sensor device 560, a valve, a motor) within the field system 500 that has failed or is failing. As another example, the control engine 806 may interact with a con-tractor or workforce scheduling system by arranging for the labor needed to replace a component or piece of equipment in the field system 500. In this way and in other ways, the controller 504 is capable of performing a number of func-tions beyond what could reasonably be considered a routine task.

In certain example embodiments, the control engine 806 may include an interface that enables the control engine 806 to communicate with the sensor devices 460, the sensor devices 560 of the power control systems 540, the control-lers 404, the other controllers 504 of the power control systems 540, the user systems 555, the network manager 580, and/or other components of the field system 500. For example, if a user system 555 operates under IEC Standard 62386, then the user system 555 may have a serial commu-nication interface that will transfer data to the controller 504. Such an interface may operate in conjunction with, or independently of, the protocols 832 used to communicate between the controller 504 and the users 550 (including corresponding user systems 555), the sensor devices 460, the sensor devices 560 of the power control systems 540, the controllers 404, the other controllers 504 of the power control systems 540, the network manager 580, and the other components of the field system 500.

The control engine 806 (or other components of the controller 504) may also include one or more hardware components and/or software elements to perform its func-tions. Such components may include, but are not limited to, a universal asynchronous receiver/transmitter (UART), a serial peripheral interface (SPI), a direct-attached capacity (DAC) storage device, an analog-to-digital converter, an inter-integrated circuit ($I^2C$), and a pulse width modulator (PWM).

The analysis module 859 of the controller 504 may be configured to obtain, using the control engine 806, the communication module 807, one or more algorithms 833, and one or more protocols 832, a measurement of the parameter associated with power (e.g., unmanipulated power 551, manipulated power 552) flowing through a phase of the power transmission equipment 575 from a sensor device 560 at a point in time. The analysis module 859 of the controller 504 may be configured to compare, using the control engine 806, the communication module 807, one or more algorithms 833, and one or more protocols 832, the measurements (e.g., as measured by one or more of the sensor devices 560) of the various parameters associated with the power transmission equipment 575, the power generation sources 545, the electrical load 589, and the other power control systems 540. The comparisons made by the analysis module 859 may include tables generated and maintained by the analysis module 859.

The analysis module 859 may also be configured to determine, using the control engine 806, the communication module 807, one or more protocols 832, and/or one or more algorithms 833, that a parameter measured by a sensor device 560 falls outside an acceptable operating range based on a current configuration of the switches 541 of an example power control system 540. The analysis module 859 may further be configured to determine, using the control engine 806, the communication module 807, one or more protocols 832, and/or one or more algorithms 833, what configuration (also called a target configuration) that the switches 541 of an example power control system 540 should change to, how quickly that change should occur, and which of the switches 541 need to be operated to achieve the new target configuration.

The analysis module 859 may also be configured to identify, using the control engine 806, the communication module 807, one or more protocols 832, and/or one or more algorithms 833, a target configuration of the switches 541 that, when implemented, results in a parameter returning to the acceptable operating range. The analysis module 859 may further be configured to operate, using the control engine 806, the communication module 807, one or more protocols 832, and/or one or more algorithms 833, one or more of the switches 541 to achieve a target configuration at a point in time.

The analysis module 859 may also be configured to identify, using the control engine 806, the communication module 807, one or more protocols 832, and/or one or more algorithms 833, how actual performance of the various components (e.g., the power transmission equipment 575, the power generation sources 545, the electrical load 589) of the field system 500 compares to forecast performance of those components. To the extent that differences exist between actual and forecast performance, the analysis module 859 may make the appropriate adjustments to stored data 834 (e.g., reorganize tables), one or more of the protocols 832, and/or one or more of the algorithms 833 to make future forecasts more accurate.

The analysis module 859 may use any of a number of techniques, protocols 832, algorithms 833, and/or other methods for performing its functions. Such methods may be used to balance a number of goals, such as reducing data, improving accuracy, and performing efficient correlations and pattern finding. Examples of such methods may include, but are not limited to, principal component analysis (PCA), restricted isometry constant (RIC) statistical method, risk management index (RMI) statistical method, artificial intelligence (AI) approaches, and machine learning/deep learning approaches.

The communication module 807 of the controller 504 determines and implements the communication protocol (e.g., from the protocols 832 of the storage repository 831) that is used when the control engine 806 communicates with (e.g., sends signals to, obtains signals from) the user systems 555, the sensor devices 460, the sensor devices 560 of the power control systems 540, the controllers 404, the other controllers 504 of the power control systems 540, the network manager 580, and the other components of the field system 500. In some cases, the communication module 807 accesses the stored data 834 to determine which communication protocol is used to communicate with another component of the system 300. In addition, the communication module 807 may identify and/or interpret the communication protocol of a communication obtained by the controller 504 so that the control engine 806 may interpret the communication. The communication module 807 may also provide one or more of a number of other services with respect to data sent from and obtained by the controller 504. Such services may include, but are not limited to, data packet routing information and procedures to follow in the event of data interruption.

The timer 835 of the controller 504 may track clock time, intervals of time, an amount of time, and/or any other measure of time. The timer 835 may also count the number of occurrences of an event, whether with or without respect to time. Alternatively, the control engine 806 may perform a counting function. The timer 835 is able to track multiple time measurements and/or count multiple occurrences concurrently. The timer 835 may track time periods based on an instruction obtained from the control engine 806, based on an instruction obtained from a user 550, based on an instruction programmed in the software for the controller 504, based on some other condition (e.g., the occurrence of an event) or from some other component, or from any combination thereof. In certain example embodiments, the timer 835 may provide a time stamp for each packet of data obtained from another component (e.g., a sensor device 460) of the field system 500.

The power module 830 of the controller 504 obtains power from a power supply (e.g., AC mains) and manipulates (e.g., transforms, rectifies, inverts) that power to provide the manipulated power to one or more other components (e.g., the timer 835, the control engine 806) of the controller 504, where the manipulated power is of a type (e.g., alternating current, direct current) and level (e.g., 12V, 24V, 120V) that may be used by the other components of the controller 504. In some cases, the power module 830 may also provide power to one or more of the sensor devices 560 and/or one or more of the switches 541 of the power control system 540.

The power module 830 may include one or more of a number of single or multiple discrete components (e.g., transistor, diode, resistor, transformer) and/or a microprocessor. The power module 830 may include a printed circuit board, upon which the microprocessor and/or one or more discrete components are positioned. In addition, or in the alternative, the power module 830 may be a source of power in itself to provide signals to the other components of the controller 504. For example, the power module 830 may be or include an energy storage device (e.g., a battery). As another example, the power module 830 may be or include a localized photovoltaic power system.

The hardware processor 821 of the controller 504 executes software, algorithms (e.g., algorithms 833), and firmware in accordance with one or more example embodiments. Specifically, the hardware processor 821 may execute software on the control engine 806 or any other portion of the controller 504, as well as software used by the users 550 (including associated user systems 555), the controllers 404, the network manager 580, and/or other components of the field system 500. The hardware processor 821 may be an integrated circuit, a central processing unit, a multi-core processing chip, SoC, a multi-chip module including multiple multi-core processing chips, or other hardware processor in one or more example embodiments. The hardware processor 821 may be known by other names, including but not limited to a computer processor, a microprocessor, and a multi-core processor.

In one or more example embodiments, the hardware processor 821 executes software instructions stored in memory 822. The memory 822 includes one or more cache memories, main memory, and/or any other suitable type of memory. The memory 822 may include volatile and/or non-volatile memory. The memory 822 may be discretely located within the controller 504 relative to the hardware processor 821. In certain configurations, the memory 822 may be integrated with the hardware processor 821.

In certain example embodiments, the controller 504 does not include a hardware processor 821. In such a case, the controller 504 may include, as an example, one or more field programmable gate arrays (FPGA), one or more insulated-gate bipolar transistors (IGBTs), and/or one or more integrated circuits (ICs). Using FPGAs, IGBTs, ICs, and/or other similar devices known in the art allows the controller 504 (or portions thereof) to be programmable and function according to certain logic rules and thresholds without the use of a hardware processor. Alternatively, FPGAs, IGBTs, ICs, and/or similar devices may be used in conjunction with one or more hardware processors 821.

The transceiver 824 of the controller 504 may send and/or obtain control and/or communication signals. Specifically, the transceiver 824 may be used to transfer data between the controller 504 and the users 550 (including associated user systems 555), the sensor devices 460, the sensor devices 560 of the power control systems 540, the controllers 404, the other controllers 504 of the power control systems 540, the network manager 580, and the other components of the field system 500. The transceiver 824 may use wired and/or wireless technology. The transceiver 824 may be configured in such a way that the control and/or communication signals sent and/or obtained by the transceiver 824 may be obtained and/or sent by another transceiver that is part of a user system 555, a sensor device 460, the sensor devices 560 of the power control systems 540, the controllers 404, the other controllers 504 of the power control systems 540, the network manager 580, and/or another component of the field system 500. The transceiver 824 may send and/or obtain any of a number of signal types, including but not limited to radio frequency signals.

When the transceiver 824 uses wireless technology, any type of wireless technology may be used by the transceiver 824 in sending and obtaining signals. Such wireless technology may include, but is not limited to, Wi-Fi, Zigbee, VLC, cellular networking, BLE, UWB, and Bluetooth. The transceiver 824 may use one or more of any number of suitable communication protocols (e.g., ISA100, HART) when sending and/or obtaining signals.

Optionally, in one or more example embodiments, the security module 823 secures interactions between the controller 504, the users 550 (including associated user systems 555), the sensor devices 460, the sensor devices 560 of the power control systems 540, the controllers 404, the other controllers 504 of the power control systems 540, the network manager 580, and the other components of the field system 500. More specifically, the security module 823 authenticates communication from software based on security keys verifying the identity of the source of the communication. For example, user software may be associated with a security key enabling the software of a user system 555 to interact with the controller 504. Further, the security module 823 may restrict receipt of information, requests for information, and/or access to information.

A user 550 (which may include an associated user system 555), the sensor devices 460, the sensor devices 560 of the power control systems 540, the controllers 404, the other controllers 504 of the power control systems 540, the network manager 580, and the other components of the field system 500 may interact with the controller 504 using the application interface 826. Specifically, the application interface 826 of the controller 504 obtains data (e.g., information, communications, instructions, updates to firmware) from and sends data (e.g., information, communications, instructions) to the user systems 555 of the users 550, the sensor devices 460, the sensor devices 560 of the power control systems 540, the controllers 404, the other controllers 504 of the power control systems 540, the network manager 580, and/or the other components of the field system 500. Examples of an application interface 826 may be or include, but are not limited to, an application programming interface, a web service, a data protocol adapter, some other hardware and/or software, or any suitable combination thereof. Similarly, the user systems 555 of the users 550, the sensor devices 460, the sensor devices 560 of the power control systems 540, the controllers 404, the other controllers 504 of the power control systems 540, the network manager 580, and/or the other components of the field system 500 may include an interface (similar to the application interface 826 of the controller 504) to obtain data from and send data to the controller 504 in certain example embodiments.

In addition, as discussed above with respect to a user system 555 of a user 550, one or more of the sensor devices 460, the sensor devices 560 of the power control systems 540, the controllers 404, the other controllers 504 of the power control systems 540, the network manager 580, and/or one or more of the other components of the field system 500 may include a user interface. Examples of such a user interface may include, but are not limited to, a graphical user interface, a touchscreen, a keyboard, a monitor, a mouse, some other hardware, or any suitable combination thereof.

The controller 504, the users 550 (including associated user systems 555), the sensor devices 460, the sensor devices 560 of the power control systems 540, the controllers 404, the other controllers 504 of the power control systems 540, the network manager 580, and the other components of the field system 500 may use their own system or share a system in certain example embodiments. Such a system may be, or contain a form of, an Internet-based or an intranet-based computer system that is capable of communicating with various software. A computer system includes any type of computing device and/or communication device, including but not limited to the controller 504. Examples of such a system may include, but are not limited to, a desktop computer with a Local Area Network (LAN), a Wide Area Network (WAN), Internet or intranet access, a laptop computer with LAN, WAN, Internet or intranet access, a smart phone, a server, a server farm, an android device (or equivalent), a tablet, smartphones, and a personal digital assistant (PDA). Such a system may correspond to a computer system as described below with regard to FIG. 9.

Further, as discussed above, such a system may have corresponding software (e.g., user system software, sensor device software, controller software). The software may execute on the same or a separate device (e.g., a server, mainframe, desktop personal computer (PC), laptop, PDA, television, cable box, satellite box, kiosk, telephone, mobile phone, or other computing devices) and may be coupled by the communication network (e.g., Internet, Intranet, Extranet, LAN, WAN, or other network communication methods) and/or communication channels, with wire and/or wireless segments according to some example embodiments. The software of one system may be a part of, or operate separately but in conjunction with, the software of another system within the field system 500.

Figure 9:
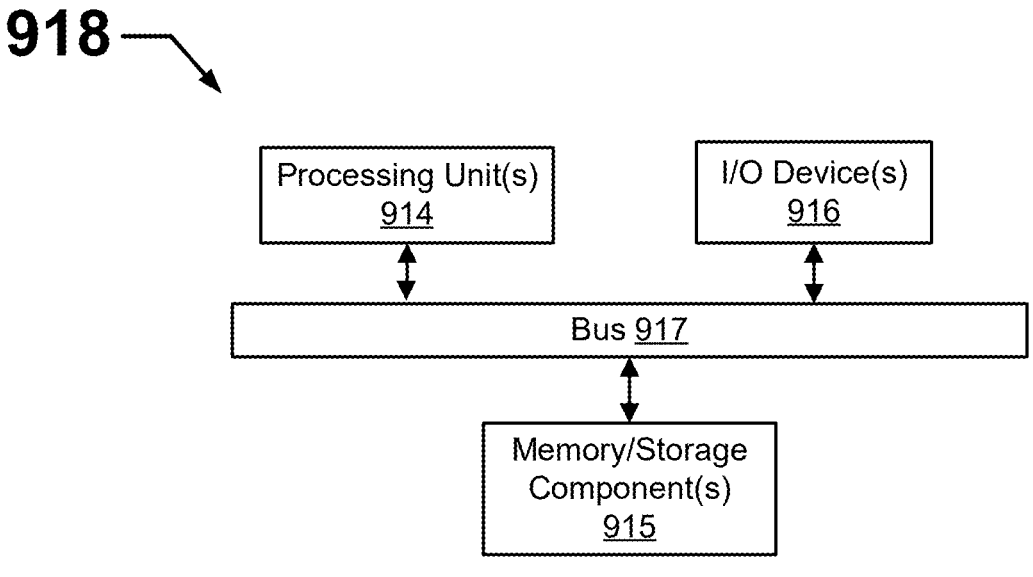
FIG. 9 shows a computing device in accordance with certain example embodiments.

FIG. 9 illustrates one embodiment of a computing device 918 that implements one or more of the various techniques described herein, and which is representative, in whole or in part, of the elements described herein pursuant to certain example embodiments. For example, a controller 504 (including components thereof, such as a control engine 806, a hardware processor 821, a storage repository 831, a power module 830, and a transceiver 824) may be considered a computing device 918 (also called a computer system 918 herein). Computing device 918 is one example of a computing device and is not intended to suggest any limitation as to scope of use or functionality of the computing device and/or its possible architectures. Neither should the computing device 918 be interpreted as having any dependency or requirement relating to any one or combination of components illustrated in the example computing device 918.

The computing device 918 includes one or more processors or processing units 914, one or more memory/storage components 915, one or more input/output (I/O) devices 916, and a bus 917 that allows the various components and devices to communicate with one another. The bus 917 represents one or more of any of several types of bus structures, including a memory bus or memory controller, a peripheral bus, an accelerated graphics port, and a processor or local bus using any of a variety of bus architectures. The bus 917 includes wired and/or wireless buses.

The memory/storage component 915 represents one or more computer storage media. The memory/storage component 915 includes volatile media (such as random access memory (RAM)) and/or nonvolatile media (such as read only memory (ROM), flash memory, optical disks, magnetic disks, and so forth). The memory/storage component 915 includes fixed media (e.g., RAM, ROM, a fixed hard drive, etc.) as well as removable media (e.g., a Flash memory drive, a removable hard drive, an optical disk, and so forth).

One or more I/O devices 916 allow a user 550 to enter commands and information to the computing device 918, and also allow information to be presented to the user 550 and/or other components or devices. Examples of input devices 916 include, but are not limited to, a keyboard, a cursor control device (e.g., a mouse), a microphone, a touchscreen, and a scanner. Examples of output devices include, but are not limited to, a display device (e.g., a monitor or projector), speakers, outputs to a lighting network (e.g., DMX card), a printer, and a network card.

Various techniques are described herein in the general context of software or program modules. Generally, software includes routines, programs, objects, components, data structures, and so forth that perform particular tasks or implement particular abstract data types. An implementation of these modules and techniques are stored on or transmitted across some form of computer readable media. Computer readable media is any available non-transitory medium or non-transitory media that is accessible by a computing device. By way of example, and not limitation, computer readable media includes "computer storage media".

"Computer storage media" and "computer readable medium" include volatile and non-volatile, removable and non-removable media implemented in any method or technology for storage of information such as computer readable instructions, data structures, program modules, or other data. Computer storage media include, but are not limited to, computer recordable media such as RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which is used to store the desired information and which is accessible by a computer.

The computer device 918 is connected to a network (not shown) (e.g., a LAN, a WAN such as the Internet, cloud, or any other similar type of network) via a network interface connection (not shown) according to some example embodiments. Those skilled in the art will appreciate that many different types of computer systems exist (e.g., desktop computer, a laptop computer, a personal media device, a mobile device, such as a cell phone or personal digital assistant, or any other computing system capable of executing computer readable instructions), and the aforementioned input and output means take other forms, now known or later developed, in other example embodiments. Generally speaking, the computer system 918 includes at least the minimal processing, input, and/or output means necessary to practice one or more embodiments.

Further, those skilled in the art will appreciate that one or more elements of the aforementioned computer device 918 is located at a remote location and connected to the other elements over a network in certain example embodiments. Further, one or more embodiments is implemented on a distributed system having one or more nodes, where each portion of the implementation (e.g., the power transmission equipment 575, the power generation sources 545, the electrical load 589, the example power control systems 540) is located on a different node within the distributed system. In one or more embodiments, the node corresponds to a computer system. Alternatively, the node corresponds to a processor with associated physical memory in some example embodiments. The node alternatively corresponds to a processor with shared memory and/or resources in some example embodiments.

Figure 10:
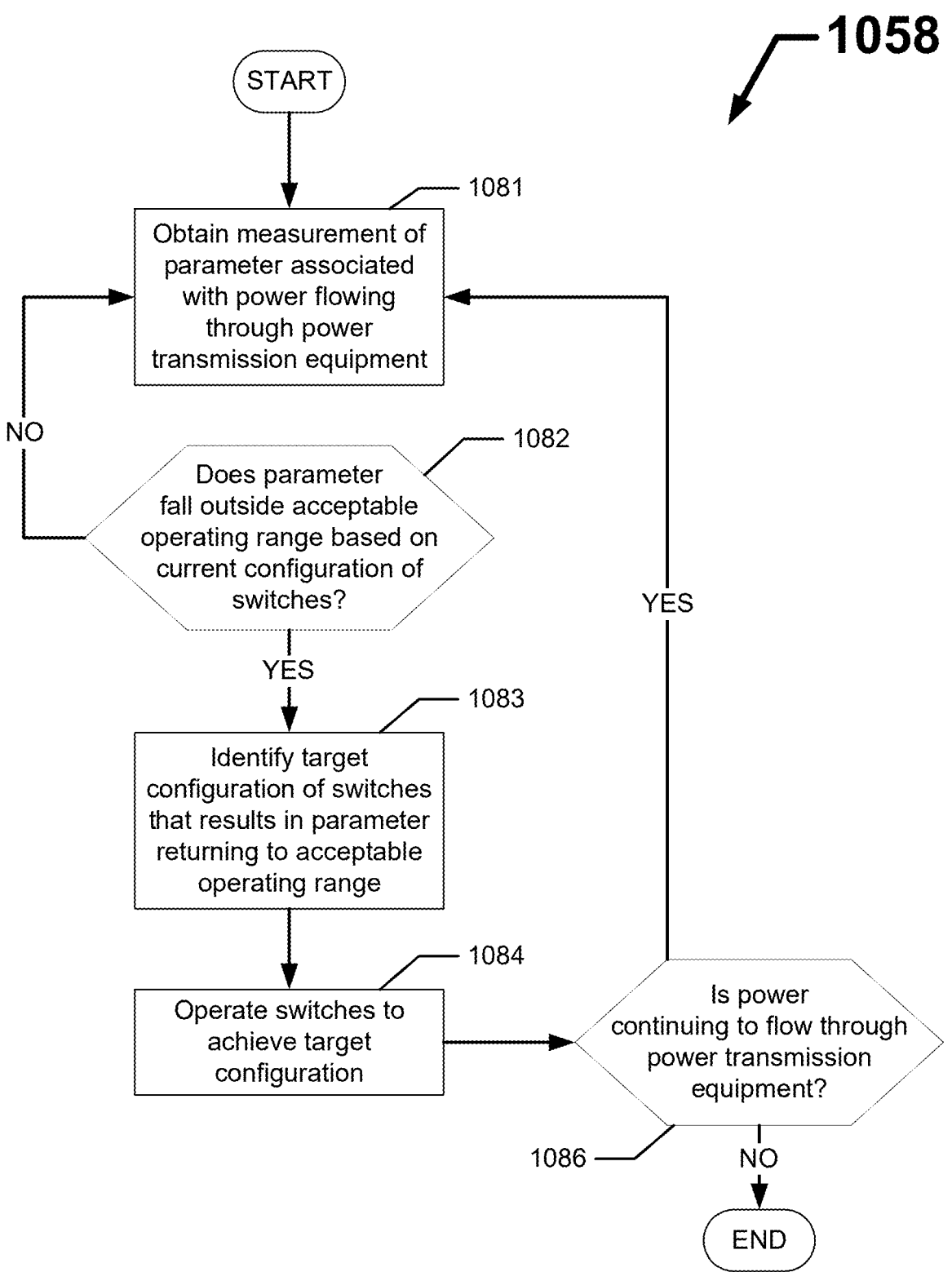
FIG. 10 shows a flowchart of a method for providing power control for power transmission equipment according to certain example embodiments.

FIG. 10 shows a flowchart 1058 of a method for providing power control for power transmission equipment according to certain example embodiments. While the various steps in this flowchart 1058 are presented sequentially, one of ordinary skill will appreciate that some or all of the steps may be executed in different orders, may be combined or omitted, and some or all of the steps may be executed in parallel. Further, in one or more of the example embodiments, one or more of the steps shown in this example method may be omitted, repeated, and/or performed in a different order. Some or all of the steps of the method of FIG. 10 may be performed off site (e.g., in a laboratory remote from a field operation). In addition, or in the alternative, some or all of the steps of the method of FIG. 10 may be performed on site where the power transmission equipment 575 (or portions thereof) are located.

In addition, a person of ordinary skill in the art will appreciate that additional steps not shown in FIG. 10 may be included in performing this method. Accordingly, the specific arrangement of steps should not be construed as limiting the scope. Further, a particular computing device, such as the computing device 918 discussed above with respect to FIG. 9, may be used to perform or facilitate performance of one or more of the steps for the methods shown in FIG. 10 in certain example embodiments. Any of the functions performed below by a controller 504 (an example of which is discussed above with respect to FIG. 8) may involve the use of one or more protocols 832, one or more algorithms 833, and/or stored data 834 stored in a storage repository 831. In addition, or in the alternative, one or more of the functions in the method may be performed by a user (e.g., user 550).

The method shown in FIG. 10 is merely an example that may be performed by using an example power control system 540 described herein. In other words, power control systems 540 for providing power control for power transmission equipment may perform other functions using other methods in addition to and/or aside from those shown in FIG. 10. Referring to the description above with respect to FIG. 1 through 9, the method shown in the flowchart 1058 of FIG. 10 begins at the START step and proceeds to step 1081, where a measurement of a parameter associated with power (e.g., unmanipulated power 551, manipulated power 552) flowing through the power transmission equipment 575 is obtained. As used herein, the term "obtaining" may include receiving, retrieving, accessing, generating, etc. or any other manner of obtaining the measurement (or other data).

The measurement may be one or more measurements made by one or more sensor devices 560 of a power control system 540 for one or more parameters that are associated with the power transmission equipment 575. Some or all of the measurements may be obtained using a controller 504 (or an obtaining component thereof) using the application interface 826, the communication module 807, one or more algorithms 833, and/or one or more protocols 832. In addition, or in the alternative, some or all of the measurements may be obtained from, or with the assistance of, a user 550, including an associated user system 555.

When the switches 541 of the power control system 540 are coupled to windings (e.g., windings 673) of a coil (e.g., coil 672) on the primary side of a transformer of the power transmission equipment 575, as shown in FIG. 6, the measurements may be made with respect to unmanipulated power 551. When the switches 541 of the power control system 540 are coupled to windings (e.g., windings 773) of a coil (e.g., coil 772) on the secondary side of a transformer of the power transmission equipment 575, as shown in FIG. 7, the measurements may be made with respect to manipulated power 552.

In step 1082, a determination is made as to whether the measurement of the parameter falls outside an acceptable operating range based on the current configuration of the switches 541. The determination may be made by a controller 504 (or the analysis module 859 thereof) using one or more algorithms 833, one or more protocols 832, the measurements of step 1081, input from a user 550 (which may include an associated user system 555), some other source of information, or any suitable combination thereof. The acceptable operating range, based on the current configuration of the switches 541 of the power control system 540, is identified, established, and maintained by the analysis module 859 of the controller 504 using one or more algorithms 833, one or more protocols 832, and stored data 834. If the measurement of the parameter falls outside an acceptable operating range based on the current configuration of the switches 541, then the process proceeds to step 1083. If the measurement of the parameter does not fall outside an acceptable operating range based on the current configuration of the switches 541, then the process reverts to step 1083.

In step 1083, a target configuration of the switches 541 that results in the parameter returning to an acceptable operating range is identified. The target configuration of the switches 541 may be identified by a controller 504 (or the analysis module 859 thereof) using one or more algorithms 833, one or more protocols 832, the measurements of step 1081, input from a user 550 (which may include an associated user system 555), some other source of information, or any suitable combination thereof.

In step 1084, the switches 541 are operated to achieve the target configuration. Operating the switches 541 to achieve the target configuration of the switches 541 may be operated by a controller 504 using one or more algorithms 833, one or more protocols 832, input from a user 550 (which may include an associated user system 555), the network manager 580, some other component of the field system 500, or any suitable combination thereof.

In step 1086, a determination is made as to whether power (e.g., unmanipulated power 551, manipulated power 552) continues to flow through the power transmission equipment 575. The determination may be based on one or more measurements made by one or more sensor devices 560 of a power control system 540 for one or more parameters that are associated with the power flowing through the power transmission equipment 575. Some or all of the measurements may be obtained using a controller 504 (or an obtaining component thereof) using the application interface 826, the communication module 807, one or more algorithms 833, and/or one or more protocols 832. In addition, or in the alternative, some or all of the measurements may be obtained from, or with the assistance of, a user 550, including an associated user system 555. If power continues to flow through the power transmission equipment 575, the process reverts to step 1081. If power does not continue to flow through the power transmission equipment 575, the process proceeds to the END step.

Figure 11:
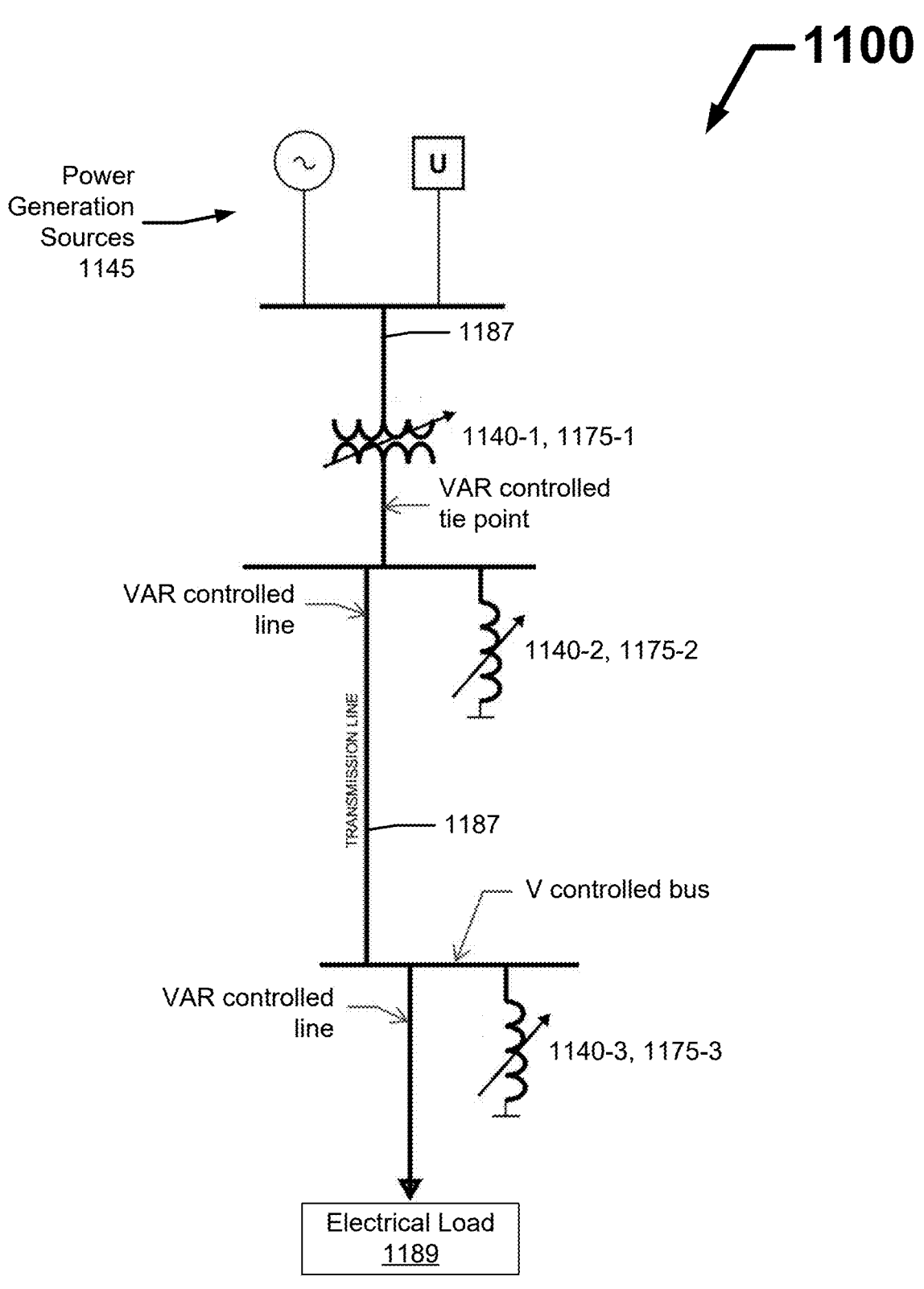
FIGS. 11 through 13 show single line diagrams of field systems having example power control systems according to certain example embodiments.
Figure 12:
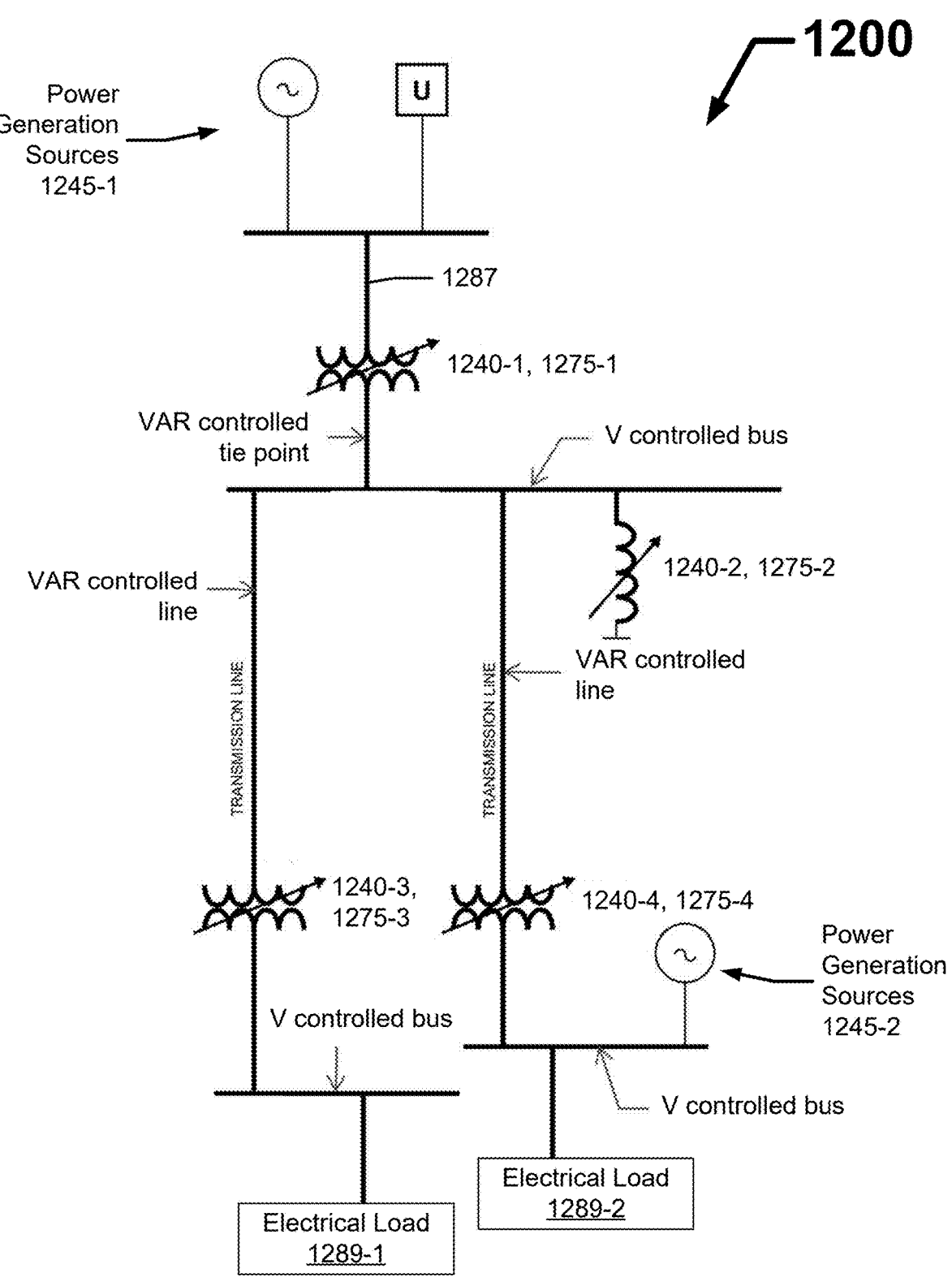
Figure 13:
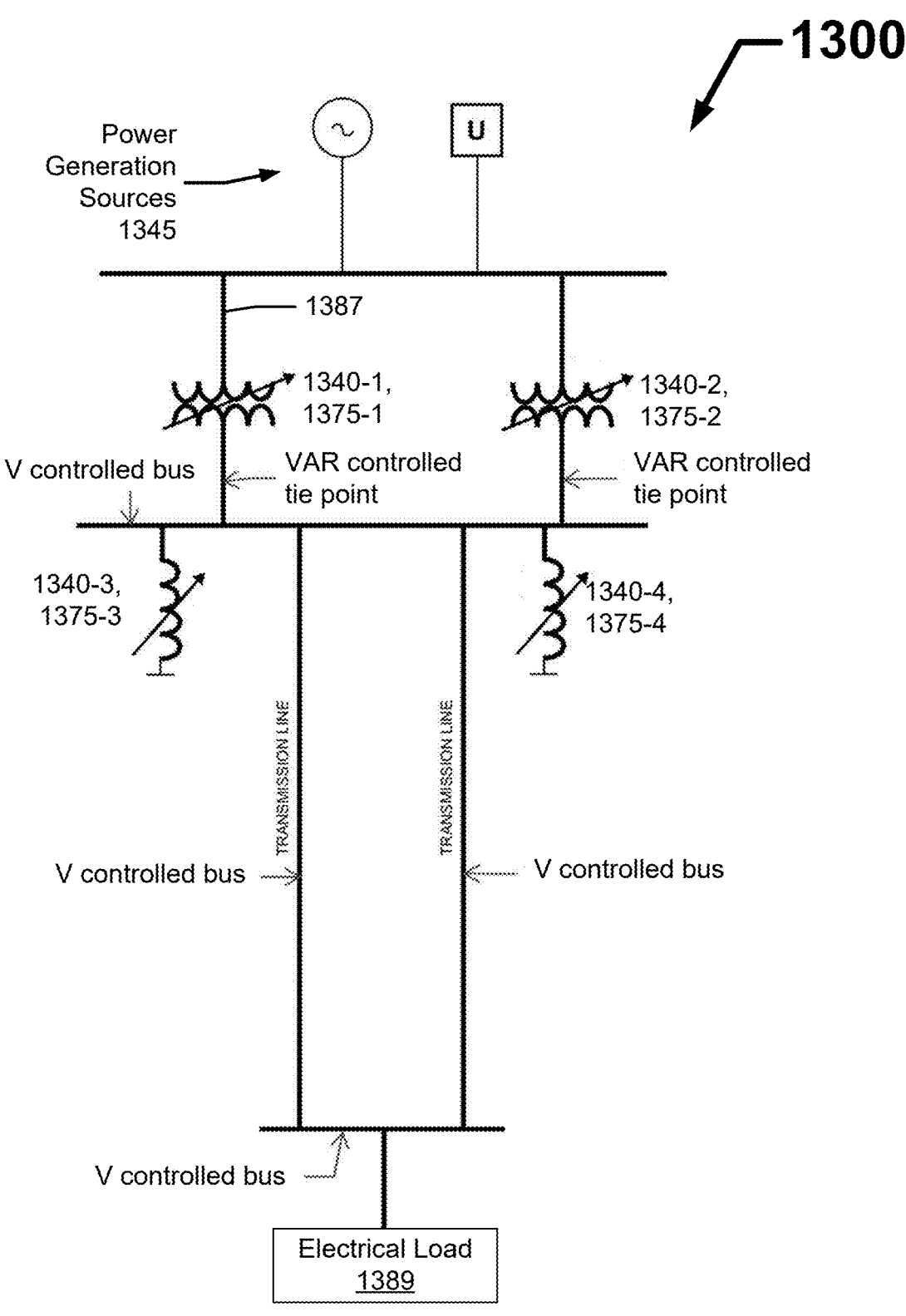

FIGS. 11 through 13 show single line diagrams of field systems having example power control systems according to certain example embodiments. Referring to the description above with respect to FIGS. 1 through 10, the field system 1100 of FIG. 11 includes power generation sources 1145, electrical load 1189, and power transfer links 1187 in the form of transmission lines in between. Integrated with the power transfer links 1187 are power transmission equipment 1175-1 (e.g., a substation with a transformer) with an example power control system 1140-1, power transmission equipment 1175-2 (e.g., another substation with a transformer) with an example power control system 1140-2, and power transmission equipment 1175-3 (e.g., yet another substation with a transformer) with an example power control system 1140-3.

The power generation sources 1145, electrical load 1189, the power transfer links 1187, the power transmission equipment 1175, and the power control systems 1140 of the field system 1100 of FIG. 11 are substantially the same as the power generation sources, electrical load, the power transfer links, the power transmission equipment, and the power control systems discussed above. The use of the example power control systems 1140 in the field system 1100, there is no need for less effective and more expensive equipment (e.g., SVCs, static synchronous compensators (STAT-COMs)) currently used in the art for regulating power.

The field system 1200 of FIG. 12 includes two groups of power generation sources 1245 (power generation sources 1245-1 and power generation sources 1245-2), two electrical loads 1289 (electrical load 1289-1 and electrical load 1289-2), and power transfer links 1287 in the form of transmission lines in between. Integrated with the power transfer links 1287 are power transmission equipment 1275-1 (e.g., a substation with a transformer) with an example power control system 1240-1, power transmission equipment 1275-2 (e.g., another substation with a transformer) with an example power control system 1240-2, power transmission equipment 1275-3 (e.g., yet another substation with a transformer) with an example power control system 1240-3, and power transmission equipment 1275-4 (e.g., still another substation with a transformer) with an example power control system 1240-4.

The power generation sources 1245, electrical load 1289, the power transfer links 1287, the power transmission equipment 1275, and the power control systems 1240 of the field system 1200 of FIG. 12 are substantially the same as the power generation sources, electrical load, the power transfer links, the power transmission equipment, and the power control systems discussed above. The use of the example power control systems 1240 in the field system 1200, there is no need for less effective and more expensive equipment (e.g., SVCs, STATCOMs) currently used in the art for regulating power.

The field system 1300 of FIG. 13 includes power generation sources 1345, an electrical load 1389, and power transfer links 1387 in the form of transmission lines in between. Integrated with the power transfer links 1387 are power transmission equipment 1375-1 (e.g., a substation with a transformer) with an example power control system 1340-1, power transmission equipment 1375-2 (e.g., another substation with a transformer) with an example power control system 1340-2, power transmission equipment 1375-3 (e.g., yet another substation with a transformer) with an example power control system 1340-3, and power transmission equipment 1375-4 (e.g., still another substation with a transformer) with an example power control system 1340-4.

The power generation sources 1345, electrical load 1389, the power transfer links 1387, the power transmission equipment 1375, and the power control systems 1340 of the field system 1300 of FIG. 13 are substantially the same as the power generation sources, electrical load, the power transfer links, the power transmission equipment, and the power control systems discussed above. The use of the example power control systems 1340 in the field system 1300, there is no need for less effective and more expensive equipment (e.g., SVCs, STATCOMs) currently used in the art for regulating power.

Example embodiments include multiple high-speed solid state switches that are used to adjust, in real time, a power component (e.g., real power, reactive power, frequency) by changing the operation of a component (e.g., a transformer, a capacitor bank) of a power transmission system. For example, multiple switches of an example power control system may be coupled in parallel to multiple windings of a coil of one or more phases of the primary and/or secondary side of a transformer. In certain example embodiments, the switches are solid state on-load tap changers. The configuration of the switches may be changed in real time to help maintain relevant parameters within acceptable operating ranges. Example embodiments may be used to reduce operational risk and improve reliability of the power operations. Example embodiments may also extend the useful life of power generation equipment and electrical load by providing sufficient power within acceptable operating ranges at all times. Example embodiments may provide a number of other benefits. Such other benefits may include, but are not limited to, ease of use, modularity, portability to other sites, flexibility to adapt based on changes in equipment, extending the life of electrical equipment, reducing damage to electrical equipment, configurability, and compliance with applicable industry standards and regulations.

Although embodiments described herein are made with reference to example embodiments, it should be appreciated by those skilled in the art that various modifications are well within the scope of this disclosure. Those skilled in the art will appreciate that the example embodiments described herein are not limited to any specifically discussed application and that the embodiments described herein are illustrative and not restrictive. From the description of the example embodiments, equivalents of the elements shown therein will suggest themselves to those skilled in the art, and ways of constructing other embodiments using the present disclosure will suggest themselves to practitioners of the art. Therefore, the scope of the example embodiments is not limited herein.

What is claimed is:

1. A power control system for power transmission equipment, the system comprising:
    a plurality of solid state on-load tap changers (SSOLTCs) electrically coupled to a phase of the power transmission equipment;
    a sensor device configured to measure a parameter associated with power flowing through the phase of the power transmission equipment; and
    a controller communicably coupled to the plurality of SSOLTCs and the sensor device, wherein the controller is configured to:
        obtain a measurement of the parameter associated with power flowing through the phase of the power transmission equipment from the sensor device at a point in time;
        determine, based on the measurement and at the point in time, that the parameter falls outside an acceptable operating range based on a current configuration of the plurality of SSOLTCs;
        identify a target configuration of the plurality of SSOLTCs that, when implemented, results in the parameter returning to the acceptable operating range; and
        operate one or more of the plurality of SSOLTCs to achieve the target configuration at the point in time.

2. The power control system of claim 1, wherein the power transmission equipment regulates real power.

3. The power control system of claim 2, wherein the power transmission equipment comprises a transformer.

4. The power control system of claim 3, wherein the plurality of SSOLTCs are electrically coupled to the phase on a primary side of the transformer.

5. The power control system of claim 3, wherein the plurality of SSOLTCs are electrically coupled to the phase on a secondary side of the transformer.

6. The power control system of claim 1, wherein the power transmission equipment regulates reactive power.

7. The power control system of claim 6, wherein the power transmission equipment comprises a capacitor bank.

8. The power control system of claim 6, wherein the power transmission equipment replaces at least one of a group consisting of a static VAR compensator and a static synchronous compensator.

9. The power control system of claim 1, wherein the power flowing through the power transmission equipment is at least 69 kV.

10. The power control system of claim 1, further comprising:
    a second plurality of SSOLTCs electrically coupled to a second phase of the power transmission equipment; and
    a second sensor device configured to measure the parameter associated with power flowing through the second phase of the power transmission equipment,
    wherein the controller is further configured to:
        obtain a second measurement of the parameter associated with power flowing through the second phase of the power transmission equipment from the second sensor device at a second point in time;
        determine, based on the second measurement and at the second point in time, that the parameter falls outside the acceptable operating range based on a current state of the second plurality of SSOLTCs;

identify a different state of at least one of the second plurality of SSOLTCs that, when implemented, results in the parameter returning to the acceptable operating range; and operate the at least one of the second plurality of SSOLTCs to the different state at the second point in time.

11. The power control system of claim 1, wherein the plurality of SSOLTCs operate using at least one of a group consisting of a variable tap percent design, an adaptive tapping rate design, and a point-on-wave tap control design.

12. The power control system of claim 1, wherein each of the plurality of SSOLTCs comprises a silicone-carbine MOSFET.

13. The power control system of claim 1, wherein the plurality of SSOLTCs are arranged in series with respect to each other and in parallel along a winding of the phase of the power transmission equipment.

14. The power control system of claim 13, wherein the plurality of SSOLTCs are arranged substantially equidistantly along the winding of the phase of the power transmission equipment.

15. The power control system of claim 1, wherein the controller is further configured to operate two or more of the plurality of SSOLTCs simultaneously.

16. The power control system of claim 1, wherein operating the one or more of the plurality of SSOLTCs to achieve the target configuration at the point in time comprises overlapping switching sequences of the one or more of the plurality of SSOLTCs.

17. The power control system of claim 1, wherein the plurality of SSOLTCs comprises at least eight SSOLTCs.

18. The power control system of claim 1, wherein the point in time is within three cycles.

19. A method for providing power control for power transmission equipment, the method comprising:

obtaining, at a point in time, a measurement of a parameter associated with power flowing through a phase of the power transmission equipment from a sensor device;

determining, based on the measurement and at the point in time, that the parameter falls outside an acceptable operating range based on a current configuration of a plurality of solid state on-load tap changers (SSOLTCs) that are electrically coupled to the phase of the power transmission equipment;

identifying a target configuration of the plurality of SSOLTCs that, when implemented, results in the parameter returning to the acceptable operating range; and facilitating operation of one or more of the plurality of SSOLTCs to achieve the target configuration at the point in time.

20. The method of claim 19, further comprising:

obtaining, at a second point in time, a second measurement of the parameter associated with power flowing through the phase of the power transmission equipment from the sensor device, wherein the second point in time follows the first point in time;

determining, based on the second measurement and at the second point in time, that the parameter falls outside the acceptable operating range based on the target configuration of the plurality of SSOLTCs;

identifying a second target configuration of the plurality of SSOLTCs that, when implemented, results in the parameter returning to the acceptable operating range; and facilitating operation of one or more of the plurality of SSOLTCs to achieve the second target configuration at the second point in time.

* * * * *